(12) United States Patent
Yang et al.

(10) Patent No.: US 10,283,615 B2
(45) Date of Patent: May 7, 2019

(54) ULTRAHIGH SELECTIVE POLYSILICON ETCH WITH HIGH THROUGHPUT

(71) Applicant: Novellus Systems, Inc., Fremont, CA (US)

(72) Inventors: Dengliang Yang, Union City, CA (US); Kwame Eason, East Palo Alto, CA (US); Faisal Yaqoob, Fremont, CA (US); Joon Hong Park, Dublin, CA (US)

(73) Assignee: Novellus Systems, Inc., Fremont, CA (US)

( * ) Notice: Subject to any disclaimer, the term of this patent is extended or adjusted under 35 U.S.C. 154(b) by 595 days.

(21) Appl. No.: 14/938,635

(22) Filed: Nov. 11, 2015

(65) Prior Publication Data

US 2016/0064519 A1    Mar. 3, 2016

Related U.S. Application Data

(60) Continuation-in-part of application No. 14/547,974, filed on Nov. 19, 2014, now abandoned, which is a
(Continued)

(51) Int. Cl.
*H01L 21/3213* (2006.01)
*H01L 21/02* (2006.01)
(Continued)

(52) U.S. Cl.
CPC .. *H01L 29/66545* (2013.01); *H01J 37/32357* (2013.01); *H01J 37/32449* (2013.01);
(Continued)

(58) Field of Classification Search
None
See application file for complete search history.

(56) References Cited

U.S. PATENT DOCUMENTS

| 5,683,538 A | 11/1997 | O'Neill et al. |
| 6,313,042 B1 | 11/2001 | Cohen et al. |

(Continued)

FOREIGN PATENT DOCUMENTS

| CN | 102741987 | 10/2012 |
| EP | 0 658 928 | 6/1995 |
| KR | 10-2008-0061930 A | 3/2008 |

OTHER PUBLICATIONS

U.S. Notice of Allowance, dated Nov. 16, 2016, issued in U.S. Appl. No. 14/547,974.
(Continued)

*Primary Examiner* — Allan W. Olsen
(74) *Attorney, Agent, or Firm* — Weaver Austin Villeneuve & Sampson LLP

(57) ABSTRACT

Provided are methods and apparatuses for removing a polysilicon layer on a wafer, where the wafer can include a nitride layer, a low-k dielectric layer, an oxide layer, and other films. A plasma of a hydrogen-based species and a fluorine-based species is generated in a remote plasma source, and the wafer is exposed to the plasma at a relatively low temperature to limit the formation of solid byproduct. In some implementations, the wafer is maintained at a temperature below about 60° C. The polysilicon layer is removed at a very high etch rate, and the selectivity of polysilicon over the nitride layer and the oxide layer is very high. In some implementations, the wafer is supported on a wafer support having a plurality of thermal zones configured to define a plurality of different temperatures across the wafer.

15 Claims, 12 Drawing Sheets

Related U.S. Application Data division of application No. 13/916,387, filed on Jun. 12, 2013, now Pat. No. 8,916,477.

(60) Provisional application No. 61/667,329, filed on Jul. 2, 2012.

(51) Int. Cl.
| | |
|---|---|
| *H01L 21/683* | (2006.01) |
| *H01L 21/67* | (2006.01) |
| *H01J 37/32* | (2006.01) |
| *H01L 29/66* | (2006.01) |

(52) U.S. Cl.
CPC .. *H01L 21/02068* (2013.01); *H01L 21/32137* (2013.01); *H01L 21/6831* (2013.01)

(56) References Cited

U.S. PATENT DOCUMENTS

| | | | |
|---|---|---|---|
| 6,406,924 B1* | 6/2002 | Grimbergen | G01B 11/0683 156/345.25 |
| 6,638,855 B1 | 10/2003 | Chang et al. | |
| 7,767,024 B2 | 8/2010 | Kao et al. | |
| 8,679,982 B2 | 3/2014 | Wang et al. | |
| 8,679,983 B2 | 3/2014 | Wang et al. | |
| 8,916,477 B2 | 12/2014 | Thedjoisworo et al. | |
| 8,969,212 B2 | 3/2015 | Ren et al. | |
| 9,034,773 B2 | 5/2015 | Thedjoisworo et al. | |
| 9,330,926 B2 | 5/2016 | Chebi et al. | |
| 9,558,928 B2 | 1/2017 | Thedjoisworo et al. | |
| 9,640,409 B1* | 5/2017 | Yang | H01L 21/0337 |
| 9,911,620 B2* | 3/2018 | Zhu | H01J 37/32357 |
| 2002/0045355 A1 | 4/2002 | Chong et al. | |
| 2002/0132422 A1 | 9/2002 | Ranade et al. | |
| 2002/0185469 A1 | 12/2002 | Podlesnik et al. | |
| 2003/0045098 A1 | 3/2003 | Verhaverbeke et al. | |
| 2003/0186545 A1* | 10/2003 | Kamp | H01L 21/31116 438/689 |
| 2004/0018741 A1* | 1/2004 | Deshmukh | H01J 37/321 438/710 |
| 2009/0184089 A1 | 7/2009 | Chebi et al. | |
| 2009/0191714 A1 | 7/2009 | Lai et al. | |
| 2009/0246965 A1 | 10/2009 | Mori et al. | |
| 2010/0003827 A1 | 1/2010 | Kessels et al. | |
| 2010/0248487 A1* | 9/2010 | Lee | H01L 21/3081 438/706 |
| 2011/0143548 A1 | 6/2011 | Cheung et al. | |
| 2011/0294300 A1 | 12/2011 | Zhang et al. | |
| 2013/0089988 A1 | 4/2013 | Wang et al. | |
| 2014/0004707 A1 | 1/2014 | Thedjoisworo et al. | |
| 2014/0004708 A1 | 1/2014 | Thedjoisworo et al. | |
| 2014/0054269 A1 | 2/2014 | Hudson et al. | |
| 2015/0064919 A1 | 3/2015 | Kim et al. | |
| 2015/0075715 A1 | 3/2015 | Thedjoisworo et al. | |
| 2015/0079797 A1 | 3/2015 | Chen et al. | |
| 2016/0042968 A1* | 2/2016 | Purayath | H01L 21/31116 438/478 |
| 2016/0043099 A1* | 2/2016 | Purayath | H01L 27/11582 438/714 |
| 2016/0064212 A1 | 3/2016 | Thedjoisworo et al. | |
| 2016/0247688 A1* | 8/2016 | Zhu | H01J 37/32357 |
| 2016/0260616 A1* | 9/2016 | Li | H01L 21/3065 |
| 2016/0300725 A1 | 10/2016 | Ambati et al. | |
| 2017/0110335 A1* | 4/2017 | Yang | H01L 21/31116 |

OTHER PUBLICATIONS

U.S. Office Action, dated Mar. 17, 2017, issued in U.S. Appl. No. 14/547,974.

U.S. Office Action, dated May 27, 2016, issued in U.S. Appl. No. 14/577,977.

U.S. Notice of Allowance, dated Sep. 27, 2016, issued in U.S. Appl. No. 14/577,977.

Taiwan Office Action and Search Report dated Nov. 22, 2016 issued in Application No. TW 102123510.

Chinese First Office Action dated Aug. 22, 2017 issued in Application No. CN 201510543852.X.

U.S. Appl. No. 14/577,977, titled "Contact Clean in High-Aspect Ratio Structures," Thedjoisworo et al., filed Dec. 19, 2014.

U.S. Office Action, dated May 7, 2014, issued in U.S. Appl. No. 13/916,387.

U.S. Notice of Allowance, dated Sep. 11, 2014, issued in U.S. Appl. No. 13/916,387.

U.S. Office Action, dated May 30, 2014, issued in U.S. Appl. No. 13/916,497.

U.S. Final Office Action, dated Nov. 6, 2014, issued in U.S. Appl. No. 13/916,497.

U.S. Notice of Allowance, dated Feb. 13, 2015, issued in U.S. Appl. No. 13/916,497.

Nishino, et al., (Jul. 15, 1993) "Damage-Free Selective Etching of Si Native Oxides Using NH3/NF3 and SF6/H2O Down-Flow Etching," *J. Appl. Phys.*, 74(3):1345-1348.

Sidhwa, et al., (Jul./Aug. 1993) "Reactive Ion Etching of Crystalline Silicon Using NF3 Diluted with H2," *J. Vac. Sci. Technol. A.*, 11(4):1156-1160.

Wolf, Stanley, Ph.D., (2002) "Silicon Processing for the VLSI Era," *Lattice Press, Sunset Beach*, 4:Chapter 3, p. 75.

\* cited by examiner

ULTRAHIGH SELECTIVE POLYSILICON ETCH WITH HIGH THROUGHPUT

CROSS-REFERENCE TO RELATED APPLICATIONS

This application claims the benefit of priority to and is a continuation-in-part of U.S. patent application Ser. No. 14/547,974, filed Nov. 19, 2014, titled "POLYSILICON ETCH WITH HIGH SELECTIVITY," which is a divisional of U.S. patent application Ser. No. 13/916,387, filed Jun. 12, 2013, titled "POLYSILICON ETCH WITH HIGH SELECTIVITY," which claims the benefit of priority to U.S. Provisional Application No. 61/667,329, filed Jul. 2, 2012, titled "POLYSILICON ETCH WITH HIGH SELECTIVITY," each of which is incorporated herein by reference in its entirety and for all purposes.

BACKGROUND

The present disclosure relates generally to the etching of polysilicon on a wafer, and more particularly to plasma-based etching of polysilicon on a wafer with a high selectivity.

Plasma-based etching can be an important processing step in the fabrication of semiconductor devices and integrated circuits.

Typically, removal of polysilicon can be performed using wet or dry reactive-ion-etch (RIE) processes. However, a wet etching process for removing polysilicon can result in a low etch rate of polysilicon, which leads to a low throughput. Furthermore, a wet etching process for removal of polysilicon may not achieve as high of selectivity over other materials as dry etching processes. A dry RIE process can result in greater cost due at least in part to complicated hardware for controlling ion direction and energy using an external bias. In addition, the use of a dry RIE process can damage surrounding structures due to exposure to ion and photon fluxes. The surrounding structures can be sidewalls made of, for example, exposed nitrides and/or oxides. Such surrounding structures can include low-k dielectric materials, silicon nitride ($Si_3N_4$), titanium nitride (TiN), and silicon oxide ($SiO_2$) including thermal silicon oxide.

Also, the presence of a native oxide layer on the surfaces of many materials, including semiconductor wafers containing silicon and metals, can adversely affect the patterning of such materials. This can be an important part in the fabrication of semiconductor chips, memory devices, or logic devices. For example, a native oxide layer on polysilicon can substantially suppress and decrease the uniformity of the etching of polysilicon. A native oxide layer may form when a silicon-containing surface is exposed to ambient conditions or oxygen.

Typically, removal of native oxides can be performed using wet processes, such as treating the native oxide with dilute hydrofluoric acid (HF). However, the use of such a wet etching process for removing native oxides may be expensive, may pose serious safety concerns, may not achieve a high selectivity over other materials, and may cause additional exposure to ambient conditions to allow native oxides to regrow prior to etching polysilicon. Wet processes may also be problematic for devices involving high-aspect-ratio features.

SUMMARY

This disclosure pertains to a method of removing a polysilicon layer from a wafer. The method includes providing a wafer having a polysilicon layer, flowing an etchant including a hydrogen-based species and a fluorine-based species into a remote plasma source, where a concentration of the hydrogen-based species is greater than a concentration of the fluorine-based species, generating a remote plasma in the remote plasma source, where the remote plasma includes radicals of the hydrogen-based species and the fluorine-based species, and exposing the wafer to the remote plasma to remove the polysilicon layer, where the wafer is maintained within a temperature range so that the wafer is substantially free of solid byproduct residue during exposure to the remote plasma.

In some implementations, the wafer includes an exposed nitride and/or oxide structure. In some implementations, the selectivity of polysilicon over the exposed nitride and/or oxide structure is greater than about 500:1 during removal of the polysilicon layer. In some implementations, the hydrogen-based species includes hydrogen or ammonia, and the fluorine-based species includes nitrogen trifluoride or carbon tetrafluoride. In some implementations, the the temperature range is less than about 60° C. In some implementations, the wafer is exposed to the remote plasma in a chamber having a pressure less than about 5 Torr. In some implementations, the wafer is supported on an electrostatic chuck with a plurality of thermal zones configured to define a plurality of different temperatures across the wafer. In some implementations, the polysilicon layer is removed at an etch rate of greater than about 2000 Å per minute. In some implementations, the concentration of the fluorine-based species is between about 0.7% and about 10% by volume, and where the concentration of the hydrogen-based species is greater than about 50% by volume. In some implementations, the etchant further includes a modifying gas species different from the fluorine-based species, where the modifying gas species includes at least one of nitrogen trifluoride, carbon tetrafluoride, fluoromethane, and sulfur hexafluoride. In some implementations, the wafer is supported on an electrostatic chuck and further includes a native oxide layer, and the method further includes applying a bias to the electrostatic chuck to generate a capacitively-coupled plasma of at least a fluorine-based etchant between the remote plasma source and the electrostatic chuck, and exposing the wafer to the capacitively-coupled plasma to remove the native oxide layer, where removal of the native oxide layer is performed in situ with removal of the polysilicon layer.

This disclosure also pertains to an apparatus for removing a polysilicon layer from a wafer. The apparatus includes a plasma etch chamber, where the plasma etch chamber includes a remote plasma source and a wafer support for supporting a wafer and outside the remote plasma source, where the wafer includes a polysilicon layer and at least one of an oxide layer and a nitride layer. The apparatus further includes a controller configured to provide instructions for performing the following operations: (a) flowing an etchant including a hydrogen-based species and a fluorine-based species into the remote plasma source, where a concentration of the hydrogen-based species is greater than a concentration of the fluorine-based species, (b) generating a remote plasma in the remote plasma source, where the remote plasma includes radicals of the hydrogen-based species and the fluorine-based species, and (c) exposing the wafer to the remote plasma to remove the polysilicon layer, where the wafer is maintained within a temperature range so that the wafer is substantially free of solid byproduct residue during exposure to the remote plasma.

In some implementations, the apparatus further includes a showerhead between the wafer support and the remote plasma source, where the plasma etch chamber is configured to generate an inductively-coupled plasma in the remote plasma source, and where the plasma etch chamber is configured to generate a capacitively-coupled plasma between the wafer support and the showerhead. In some implementations, the wafer support includes a plurality of thermal zones configured to define a plurality of different temperatures across the wafer. In some implementations, the temperature range is less than about 60° C. In some implementations, the etchant further includes a modifying gas species different from the fluorine-based species, where the modifying gas species includes at least one of nitrogen trifluoride, carbon tetrafluoride, fluoromethane, and sulfur hexafluoride. In some implementations, the wafer includes a native oxide layer on the polysilicon layer, and the controller is further configured with instructions for performing the following operations: applying a bias to the wafer support to generate a capacitively-coupled plasma of at least a fluorine-based etchant between the remote plasma source and the wafer support, and exposing the wafer to the capacitively-coupled plasma to remove the native oxide layer, wherein removal of the native oxide layer is performed in situ with removal of the polysilicon layer.

These and other embodiments are described further below with reference to the figures.

DETAILED DESCRIPTION

Introduction

In the following description, numerous specific details are set forth in order to provide a thorough understanding of the presented concepts. The presented concepts may be practiced without some or all of these specific details. In other instances, well known process operations have not been described in detail so as to not unnecessarily obscure the described concepts. While some concepts will be described in conjunction with the specific embodiments, it will be understood that these embodiments are not intended to be limiting.

Plasma-based etching can be used in the fabrication of integrated circuits. For a variety of technology nodes, such as in the 1x-nm or the 2x-nm node, new classes of materials for structures such as memory-device stacks can offer tremendous advantages. Fabrication processes such as etching of a particular layer may need to be relatively benign to such new materials while also etching at a high efficiency. While it may be desirable to achieve etching of certain materials like polysilicon at a high efficiency for high throughput, it may also be desirable to minimize losses to surrounding exposed materials to avoid adversely affecting device performance.

A remote or downstream plasma can provide acceptable etch rates while minimizing losses of surrounding materials. In some implementations, for example, the materials can include $Si_3N_4$ and/or TiN. The $Si_3N_4$ can be used as spacers, liners, and/or etch stop layers, and the TiN can be used as metal-gate structures or electrodes. A remote or downstream plasma can provide conditions that can minimize the damage caused by direct plasma exposure, including ion impact damage, charging damage, and defects introduced by high fluxes of energetic photons.

Device Structure

Figure 1:
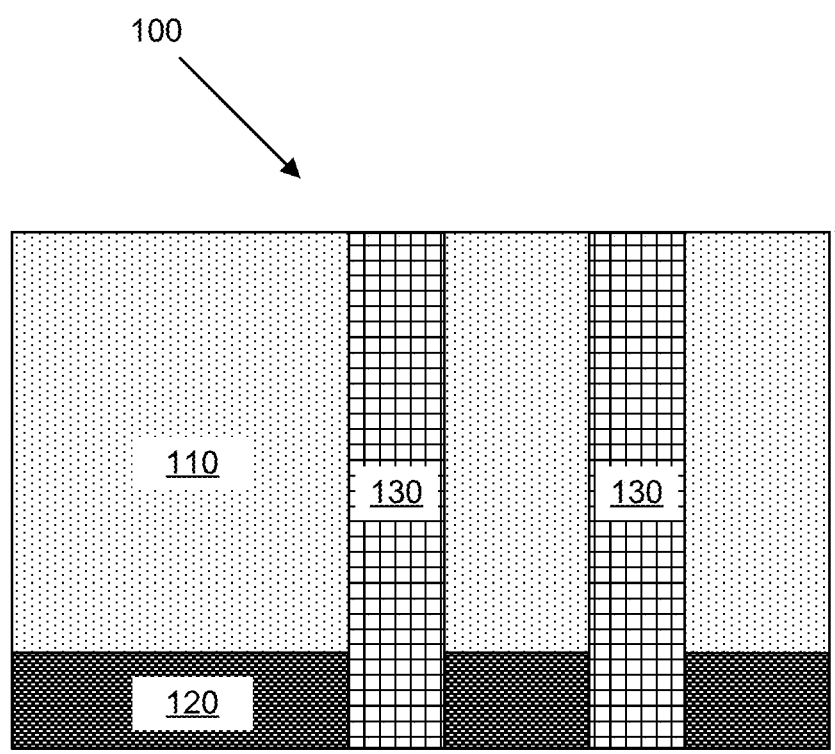
FIG. 1 illustrates a cross-section of an example of a structure with a polysilicon layer over an underlying layer and having multiple vertical structures.

FIG. 1 illustrates a cross-section of an example of a device structure with a polysilicon layer. As illustrated in the device structure 100 in FIG. 1, the polysilicon layer 110 can be over an underlying layer 120, which can include $Si_3N_4$. The polysilicon layer 110 can also be separated by multiple vertical structures 130 that can each include TiN and/or $Si_3N_4$, for example. In some implementations, the polysilicon layer 110 can include polysilicon that is annealed. Annealed polysilicon can be more crystalline and relaxed than non-annealed polysilicon, and can etch at a different rate than non-annealed polysilicon. It will be understood by a person of ordinary skill in the art that the polysilicon layer 110 can be surrounded and/or separated by any number of different materials.

In the example in FIG. 1, the device structure 100 may be a memory device or logic device. The underlying $Si_3N_4$ layer 120 can serve as an etch stop and the TiN and $Si_3N_4$ vertical structures 130 can be electrodes. In some implementations, the polysilicon layer 110 is etched and then a space between the TiN and $Si_3N_4$ vertical structures 130 is filled with a dielectric material to create a capacitor in between the TiN and $Si_3N_4$ vertical structures 130.

In the example in FIG. 1, the thickness of the polysilicon layer 110 can be between about 1 μm and about 2 μm, such as between about 1.10 μm and about 1.35 μm. In addition, the TiN and $Si_3N_4$ vertical structures 130 can also be between about 1 μm and about 2 μm, such as between about 1.10 μm and about 1.35 μm. It will be understood by a person of ordinary skill in the art that the memory or logic device structure 100 can have varying thicknesses and orientations.

In the example in FIG. 1, the dimensions of the polysilicon and other features can depend on the application and technology node. In some implementations, the thickness of the polysilicon for removal can be about 1.3 μm, which can correspond to a 2x-nm node. For a technology node that is the 2x-nm, this can correspond to features (e.g., gate width) of about 22 nm or less. In some implementations, the thickness of the polysilicon for removal can be about 1.5 μm, which can correspond to a 1x-nm node. For a technology node that is the 1x-nm node, this can correspond to features (e.g., gate width) of about 16 nm or less.

Figure 2:
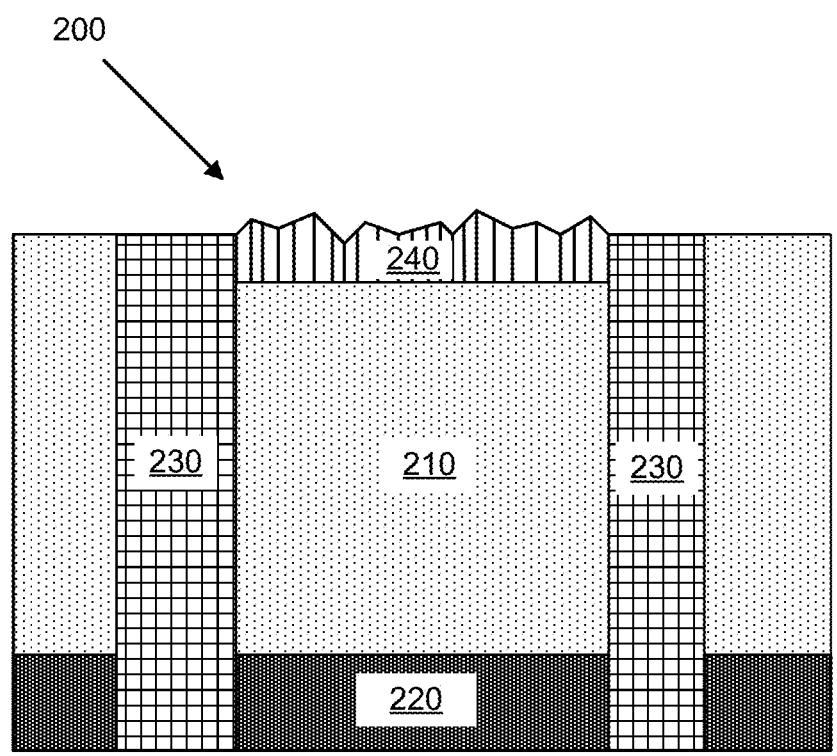
FIG. 2 illustrates a cross-section of an example of a structure with a polysilicon layer and a native silicon oxide layer over the polysilicon layer.

Removal of polysilicon or any other silicon-containing structure can be hindered by the presence of native oxides. A native silicon oxide layer can form on a polysilicon layer or other silicon-containing layer when exposed to ambient conditions or oxygen. FIG. 2 illustrates a cross-section of an example of a structure with a native silicon oxide layer over a polysilicon layer.

In FIG. 2, a device structure 200 can be similar to the device structure 100 provided earlier in FIG. 1. A polysilicon layer 210 can be separated by vertical structures 230 that can each include TiN and/or $Si_3N_4$. The polysilicon layer 210 can also be disposed over an underlying layer 220, which can include $Si_3N_4$. In some implementations the device structure 200 can be a memory device or logic device, where the underlying layer 220 is an etch stop and the vertical structures 230 are electrodes. A native silicon oxide layer 240 can be formed over the polysilicon layer 210. In some implementations, an oxygen-containing layer (e.g., silicon oxynitride) can form on the $Si_3N_4$ in the vertical structures 230.

When oxygen reacts with silicon at the surface of silicon-containing structure, the native silicon oxide layer 240 can form. The native silicon oxide layer 240 can have a thickness between about 5 Å and about 50 Å, or between about 10 Å and about 30 Å. Since the native silicon oxide layer 240 is not intentionally fabricated or synthesized, but formed upon exposure to any environment that contains an oxidant, the structure of the native silicon oxide layer 240 may be non-uniform and highly amorphous.

The presence of the native silicon oxide layer 240 can hinder chemical reactions when trying to perform chemical reactions on underlying materials. Specifically, the native silicon oxide layer 240 can hinder the etching of the polysilicon layer 210, suppressing and increasing the non-uniformity of polysilicon removal. This can adversely impact throughput and device performance.

It is desirable to remove the native silicon oxide layer 240 prior to removing the polysilicon layer 210 while incurring minimal loss of surrounding materials, such as the vertical structures 230 containing TiN and/or $Si_3N_4$. In some implementations, it is desirable to remove both the native silicon oxide layer 240 and the polysilicon layer 210 while incurring minimal loss of surrounding materials.

Typically, removal of a native silicon oxide layer on a wafer is achieved by a wet etching processing, such as dipping the wafer into a bath containing dilute HF and then transferring to another reaction chamber for further processing. This wet etching process can have several drawbacks, such as allowing native oxides to regrow during queue time while transferring the wafer, a relatively high cost of ownership, and utilizing solvents that are toxic, dangerous, and non-environmentally friendly. In addition, wet processing may compromise the integrity of high-aspect-ratio structures found in devices. However, the disclosed implementations described herein may alleviate at least some of the drawbacks by applying a method of removing a native silicon oxide layer on a wafer with high selectivity and using a dry plasma etching process. In some instances, the dry plasma etching process for removing the native silicon oxide layer can be performed in situ with the polysilicon etching process.

Figure 3A:
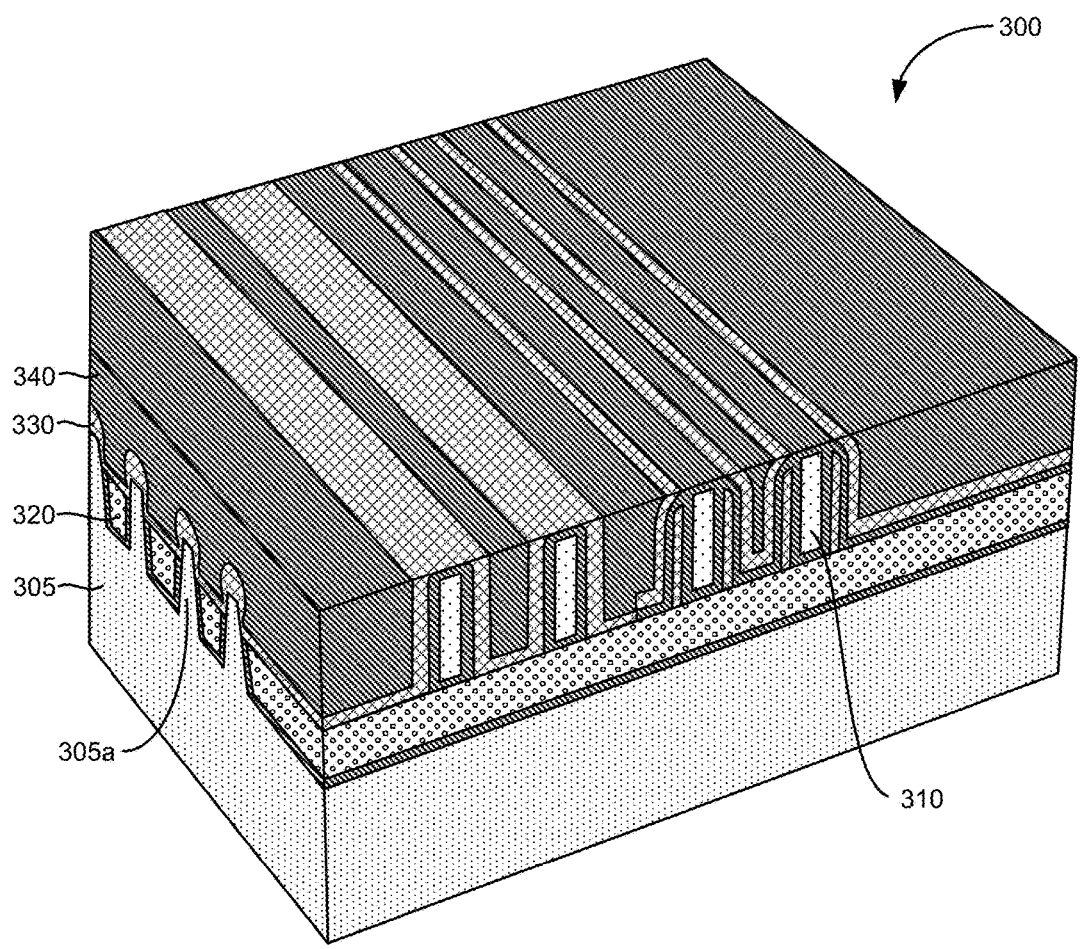
FIG. 3A illustrates a three-dimensional schematic representation of a portion of an example fin field-effect transistor (finFET) structure.

FIG. 3A illustrates a three-dimensional schematic representation of a portion of an example fin field-effect transistor (finFET) structure. A finFET structure 300 can include a semiconductor wafer 305. The semiconductor wafer 305 can include a plurality of fins 305a that are made of silicon. A dielectric material 320, such as shallow trench isolation (STI) oxide, is formed between adjacent silicon fins 305a. The dielectric material 320 can include a low dielectric oxide material, such as silicon oxide. A plurality of polysilicon layers 310 may be formed over portions of the dielectric material 320. In some implementations, the polysilicon layers 310 may include vertical structures of polysilicon that are perpendicular to the silicon fins 305a. The finFET structure 300 can further include silicon nitride liners 330 formed on the dielectric material 320 and around the polysilicon layers 310. The finFET structure 300 can further include a mask 340 over the silicon nitride liner 330 and the silicon fins 305a.

Figure 3B:
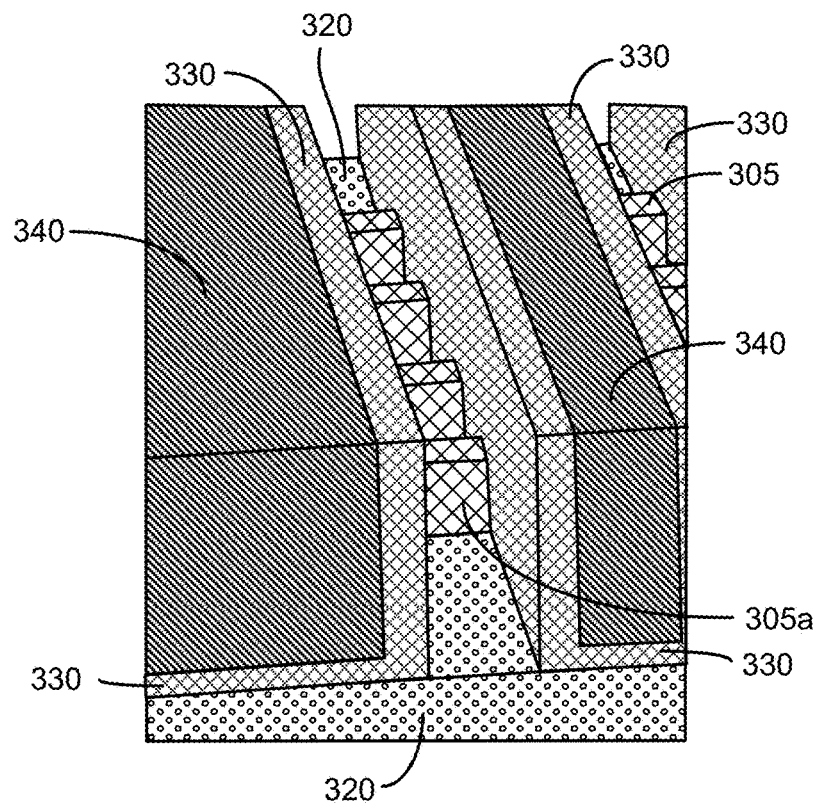
FIG. 3B illustrates a magnified view of the example finFET structure of FIG. 3A after etching polysilicon.
Figure 3C:
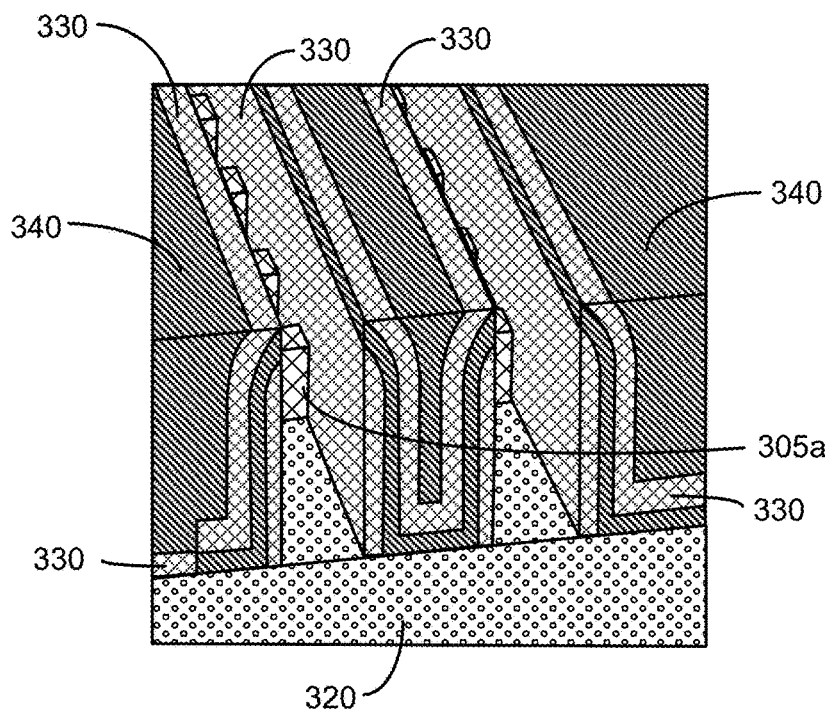
FIG. 3C illustrates another magnified view of the example finFET structure of FIG. 3A after etching polysilicon.

FIG. 3B illustrates a magnified view of the example finFET structure of FIG. 3A after etching polysilicon. FIG. 3C illustrates another magnified view of the example finFET structure of FIG. 3A after etching polysilicon. A dry etching process can selectively remove the polysilicon layers 310. The dry etching process can be highly selective to a thin layer of oxide (not shown) that protects the silicon fins 305a, the dielectric material 320, and the silicon nitride liners 330. Thus, the dry etching process can effectively remove polysilicon while being selective against the thin layer of oxide that protects silicon, silicon oxide, and silicon nitride. In FIGS. 3B and 3C, the dry etching process removes the polysilicon layers while leaving the silicon fins 305a, the dielectric material 320, and the silicon nitride liners 330 free of residues and defects.

Process Conditions

The present disclosure relates to a method of removing polysilicon at a high etch rate with a high selectivity against exposed nitride and/or oxide layers. The method includes providing a wafer having a polysilicon layer. In some implementations, the wafer further includes a native oxide layer over the polysilicon layer, and also at least one of a nitride layer and an oxide layer. The method further includes flowing an etchant including a hydrogen-based species and a fluorine-based species into a remote plasma source, where a concentration of the hydrogen-based species is greater than a concentration of the fluorine-based species. A remote plasma is generated in the remote plasma source, where the remote plasma includes radicals of the hydrogen-based species and the fluorine-based species. The wafer is exposed to the remote plasma to remove the polysilicon layer, where the wafer is maintained within a temperature range so that the wafer is substantially free of solid byproduct residue during exposure to the remote plasma. In some implementations, removal of the polysilicon layer is performed at an etch rate greater than about 2000 Å per minute and with a selectivity greater than about 500:1 over the nitride and/or oxide layer.

The wafer can include any semiconductor wafer, partially integrated circuit, printed circuit board, or other appropriate work piece. Process conditions may vary depending on the wafer size. Typically, many fabrication facilities are configured for 200-mm wafers, 300-mm, or 450-mm wafers. The disclosed implementations described herein are configured to operate on any suitable wafer size, such as 300-mm and 450-mm wafer technologies.

Figure 10:
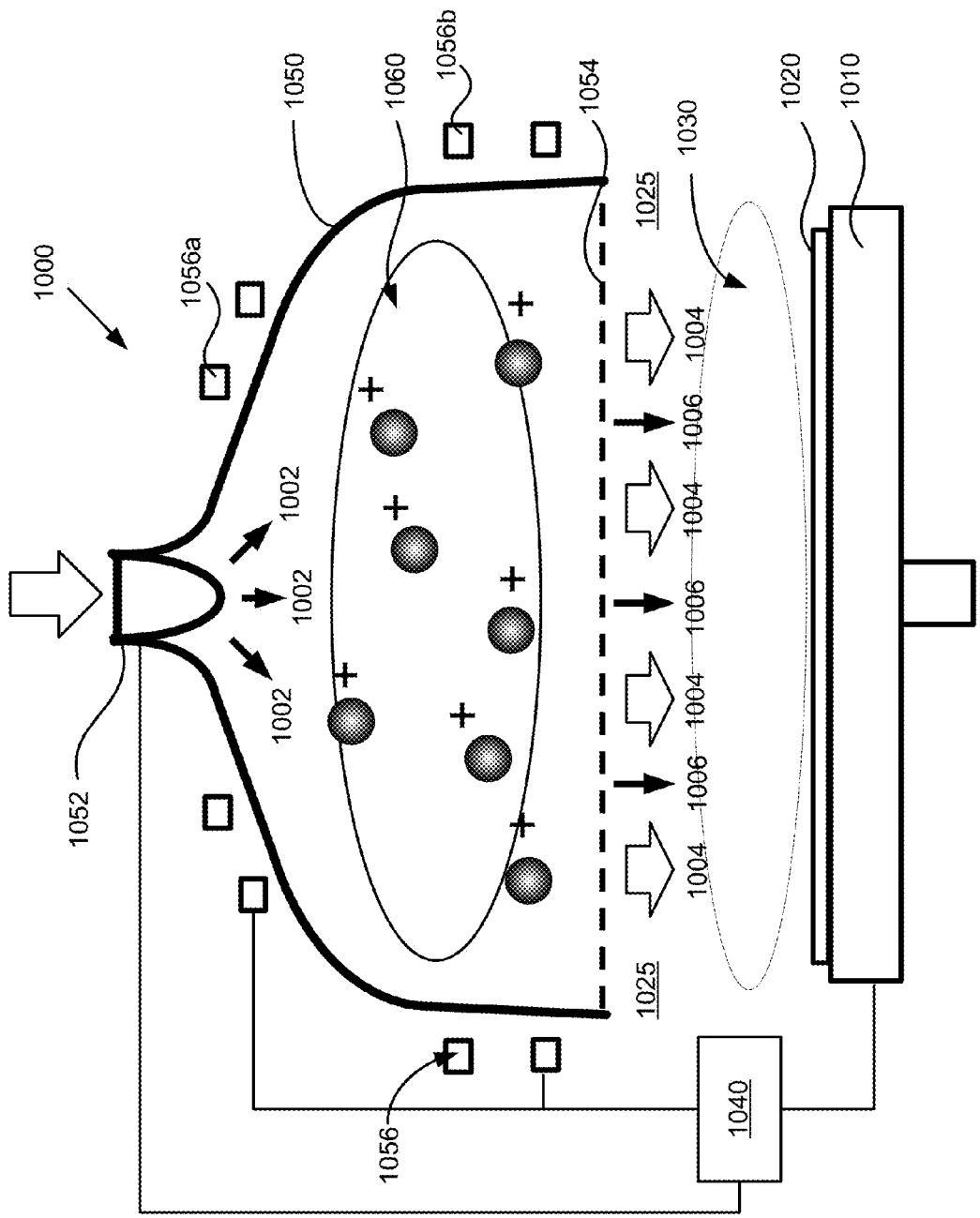
FIG. 10 shows a schematic diagram of a plasma processing apparatus for performing the process of removing polysilicon from a wafer.

In some implementations, the removal of polysilicon can be carried out by a plasma processing apparatus with a remote plasma source, such as the plasma processing apparatus or plasma reactor described with respect to FIG. 10. The gases introduced into the plasma reactor described in FIG. 10 can vary with the application. In some implementations, an etch reaction can be carried out using a hydrogen-based etchant. The hydrogen-based etchant can include, for example, hydrogen ($H_2$). Another example can include ammonia ($NH_3$). In some embodiments, an etch reaction can be carried out using a combination of $H_2$ and a fluorine-based species, such as nitrogen trifluoride ($NF_3$), carbon tetrafluoride ($CF_4$), or sulfur hexafluoride ($SF_6$). Gases such as $H_2$ and $NF_3$ are non-toxic and generally do not have adverse effects on the environment.

Using a hydrogen-based species as an etchant effectively etches polysilicon while acting as a reducing agent that minimizes the oxidation and loss of other exposed materials, such as TiN, $Si_3N_4$, and $SiO_2$. An oxidizing agent such as oxygen may increase the etch rate of polysilicon but may also oxidize and increase the losses to other exposed materials. Adding a fluorine-based species as an etchant with a hydrogen-based species can increase the etch rate of polysilicon, but can also increase the losses to other exposed materials if the concentration of the fluorine-based species exceeds a certain limit.

As discussed earlier herein, the hydrogen-based species can include $H_2$ or $NH_3$, and the fluorine-based species can include $NF_3$, $CF_4$, or $SF_6$. Other examples of fluorine-based species can include hexafluoroethane ($C_2F_6$), trifluoromethane ($CHF_3$), difluoromethane ($CH_2F_2$), fluoromethane ($CH_3F$), octofluoropropane ($C_3F_8$), octofluorocyclobutane ($C_4F_8$), octofluoro[1-]butane ($C_4F_8$), octofluoro[2-]butane ($C_4F_8$), octofluoroisobutylene ($C_4F_8$), fluorine ($F_2$), and the like. The plasma reactor can activate the hydrogen-based species and the fluorine-based species to form radicals, ions, and other plasma-activated species. The plasma reactor can generate a plasma including radicals of the hydrogen-based species and fluorine-based species. The plasma can be used to perform a plasma etch of polysilicon, where the plasma etch can be a $H_2/NF_3$ plasma etch.

The process conditions of the plasma etch can affect the etch rates of polysilicon and exposed nitrides and/or oxides. Various process parameters such as surface temperature, pressure, source power, flow rates of the gases, gas composition, wafer size, and relative concentrations of the etchant gases can affect the process conditions and, hence, the etch rates of polysilicon and exposed nitrides and/or oxides. Such process parameters may be optimized within a "process window" to maximize the etch rate of polysilicon while limiting the etch rates of the exposed nitrides and/or oxides.

The hydrogen-based species provides active species that will be ionized or radicalized in a remote plasma source to form a plasma. Without being limited by any theory, the etching of polysilicon can occur by successive addition of adsorbed hydrogen atoms to silicon atoms to form Si—$H_x$ complexes, where the number of chemisorbed hydrogen atoms grows from x=1, 2, and 3, i.e., SiH, $SiH_2$, and $SiH_3$. Such a reaction mechanism occurs at least in the presence of pure $H_2$ plasma. The addition of a hydrogen atom to $SiH_3$ promotes formation of volatile silane, $SiH_4$, which facilitates etching of polysilicon. The following equation can describe the overall Si-etch reaction: $Si_{(s)} + 4H^* \rightarrow SiH_{4(g)}$.

Other chemical reactions may facilitate the removal of polysilicon. Fluorine radicals may react with silicon atoms and form volatile tetrafluorosilane, $SiF_4$, in the following reaction: $Si_{(s)} + 4F^* \rightarrow SiF_{4(g)}$. When hydrogen radicals and fluorine radicals react with silicon atoms to form volatile silane and tetrafluorosilane, respectively, no solid byproduct is formed. A process window that removes silicon atoms without the formation of solid byproduct can be referred to as a "clean regime."

Typically, the introduction of the hydrogen-based species and the fluorine-based species in a plasma form gas phase reactants, such as HF, $NH_4F \cdot HF$, and $NH_4F$. These gas phase reactants and other plasma-activated species can potentially react with silicon atoms to form a solid byproduct, such as ammonium hexafluorosilicate (($NH_4)_2SiF_6$). An example of such a chemical reaction can be shown in the following chemical pathway: $Si_{(s)} + 4HF_{(g)} + 2NH_4F_{(g)} \rightarrow ((NH_4)_2SiF_6)_{(s)} + 2H_{2(g)}$. A process window that removes silicon atoms but involves the formation of a solid byproduct can be referred to as a "deposition regime." The solid byproduct may be sublimed at slightly elevated temperatures, such as temperatures greater than about 60° C. or greater than about 75° C., so that polysilicon is removed and only gaseous byproducts are formed after removal of polysilicon.

Figure 4A:
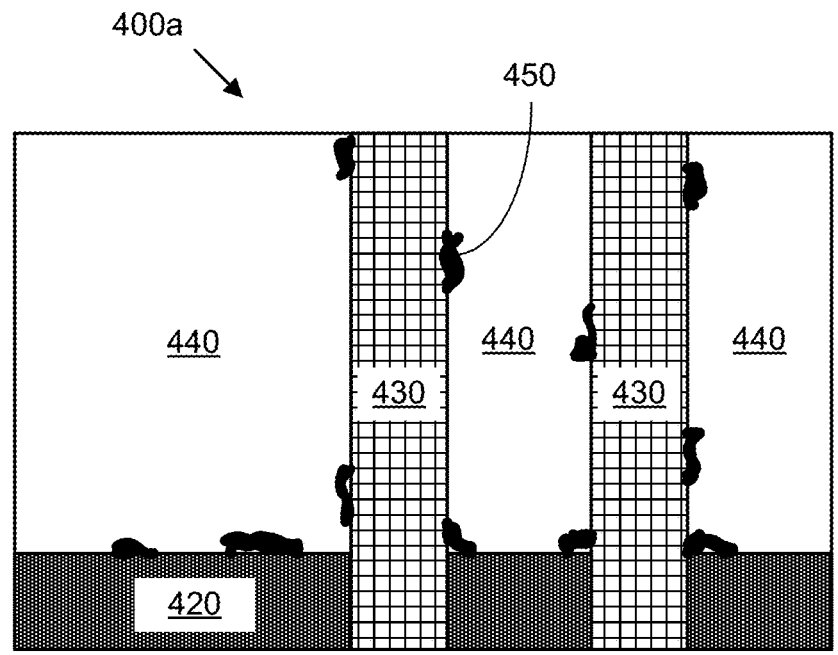
FIG. 4A shows a cross-sectional schematic of a device structure with salt residue after etching polysilicon.

FIG. 4A shows a cross-sectional schematic of a device structure with salt residue after etching polysilicon. After etching polysilicon (not shown), a device structure 400a includes recesses 440 between vertical structures 430. The vertical structures 430 can include layers of silicon nitride and/or silicon oxide, such as thermal silicon oxide. The device structure 400a further includes an underlying layer 420, which can include silicon nitride and/or silicon oxide. Etching of the polysilicon to form recesses 440 can occur up to the underlying layer 420. In some implementations, the underlying layer 420 is an etch stop and the vertical structures 430 are electrodes. In FIG. 4A, salt residue 450 can form on sidewalls of the vertical structures 430 and on the surface of the underlying layer 420. Process conditions, including temperature and pressure, can kinetically favor the formation of the salt residue 450 in FIG. 4A. Removal of the salt residue 450 can require temperature treatment to sublimate the salt residue 450 during or after removal of the polysilicon. The presence of salt residue 450 can limit throughput and adversely affect device performance.

Figure 4B:
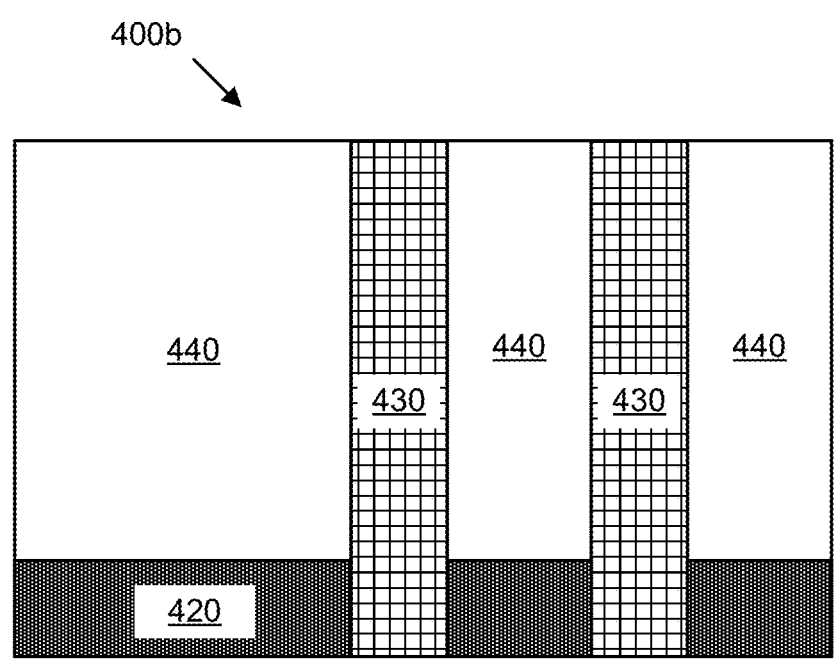
FIG. 4B shows a cross-sectional schematic of a device structure free of salt residue after etching polysilicon.

FIG. 4B shows a cross-sectional schematic of a device structure free of salt residue after etching polysilicon. After etching polysilicon (not shown), a device structure 400b includes recesses 440, vertical structures 430, and underlying layer 420 that are free of salt residue 450. Process conditions, including temperature and pressure, can kinetically favor reactions under the clean regime. That way, throughput can be increased by etching polysilicon without a separate temperature treatment step to sublimate salt residue 450.

As discussed above, polysilicon can be removed by at least one of the following chemical pathways: (1) $Si_{(s)} + 4H^* \rightarrow SiH_{4(g)}$; (2) $Si_{(s)} + 4F^* \rightarrow SiF_{4(g)}$; and (3) $Si_{(s)} + 4HF_{(g)} + 2NH_4F_{(g)} \rightarrow ((NH_4)_2SiF_6)_{(s)} + 2H_{2(g)}$. The first two chemical pathways avoid the formation of solid byproduct or salt, whereas the last chemical pathway involves the formation of solid byproduct or salt. Process conditions, such as feed gas ratio, chamber pressure, and wafer temperature, can influence the reaction kinetics to favor certain chemical pathways over others. Reaction kinetics can be driven by the activation energy and diffusivity of species at the wafer surface. Without being limited by any theory, the diffusivity of gaseous species, such as $NH_4F$, can be influenced by the wafer temperature. Control of wafer temperature can control the diffusivity of gaseous species, such as $NH_4F$, thereby limiting the formation of solid byproduct, such as $(NH_4)_2SiF_6$. Thus, appropriate process conditions can control selection of chemical pathways to etch polysilicon under a clean regime or a deposition regime.

The process conditions for a clean regime can occur under relatively low temperature and/or low pressure conditions. In some implementations, the temperature of the wafer can be less than about 120° C., or less than about 60° C. For example, the temperature of the wafer can be between about 20° C. and about 120° C., or between about 20° C. and about 50° C. In some implementations, the chamber pressure is less than about 5 Torr, or less than about 1 Torr. For example, the chamber pressure can be between about 0.1 Torr and about 5 Torr.

In some implementations, removal of polysilicon can occur at an etch rate of greater than about 1000 Å per minute, and even greater than 2000 Å per minute under the clean regime. In some implementations, the wafer can include exposed nitride and/or oxide layers, where the exposed nitride layer can include silicon nitride and the exposed oxide layer can include thermal silicon oxide. The etch rates of the exposed nitride and/or oxide layer can be less than about 5 Å per minute, or less than about 2 Å per minute, or less than about 1 Å per minute. Thus, the selectivity of polysilicon to exposed nitride and/or oxide can be greater than about 100:1, or greater than about 500:1. Such high selectivity may be achieved while the polysilicon etch rate is greater than about 2000 Å per minute.

In some implementations, process conditions where the wafer temperature is greater than 60° C. can sublimate salt residue, where such wafer temperatures that sublimate salt residue can represent the deposition regime. Process conditions where the wafer temperature was less than 60° C. did not result in salt formation, where such wafer temperatures that did not result in salt formation can represent the clean regime. In some implementations, the process conditions under the clean regime can etch polysilicon at an etch rate of greater than 2000 Å per minute. In addition, the selectivity against TEOS can be greater than 500:1, and the selectivity against $Si_3N_4$ can be greater than 100:1. Thus, not only does the clean regime avoid unwanted deposition of solid byproduct, but the clean regime can provide a higher etch rate of polysilicon compared to the deposition regime and greater selectivity against oxide and nitride compared to the deposition regime.

Figure 5A:
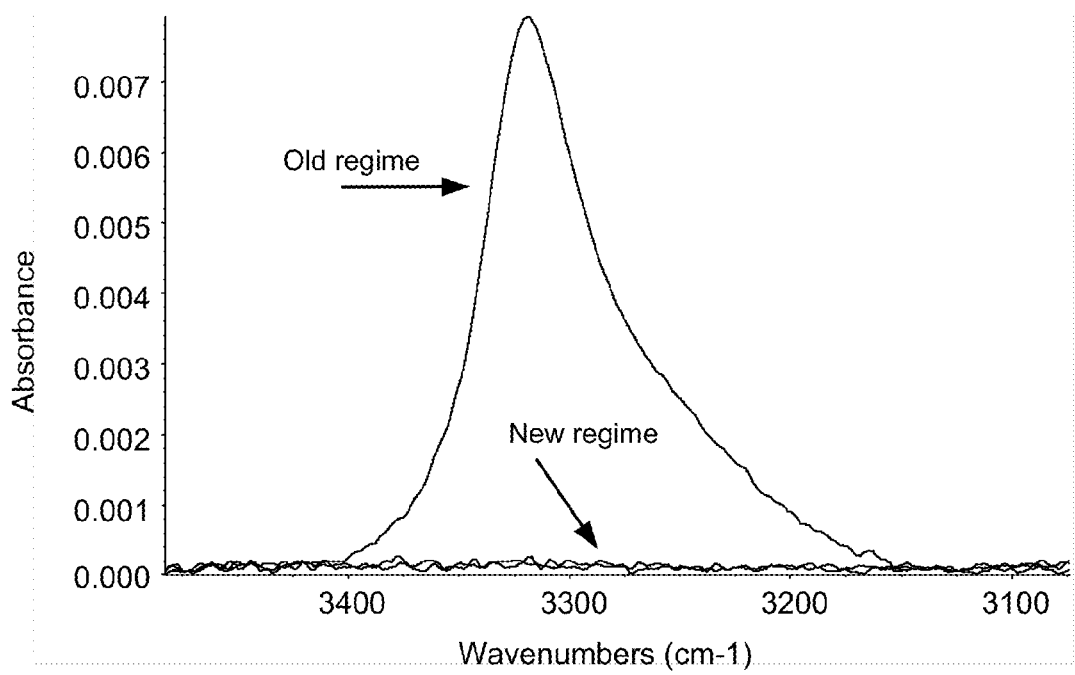
FIGS. 5A-5C show Fourier-Transform infrared spectroscopy (FTIR) graphs with vibration peaks for detecting ammonium hexafluorosilicate ($(NH_4)_2SiF_6$) in various temperature regimes.
Figure 5B:
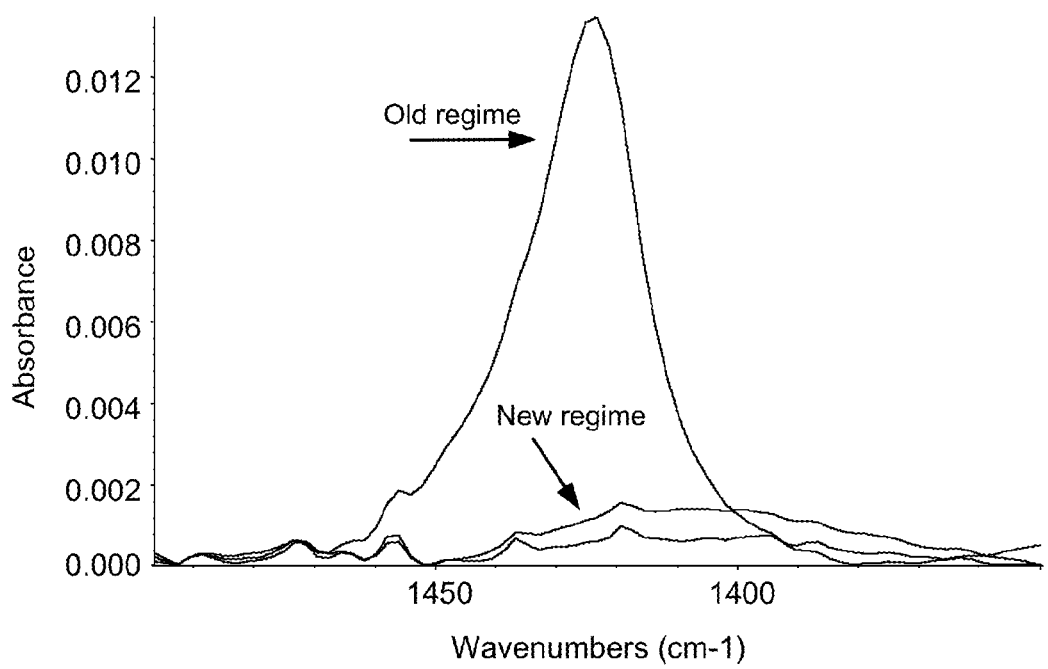
Figure 5C:
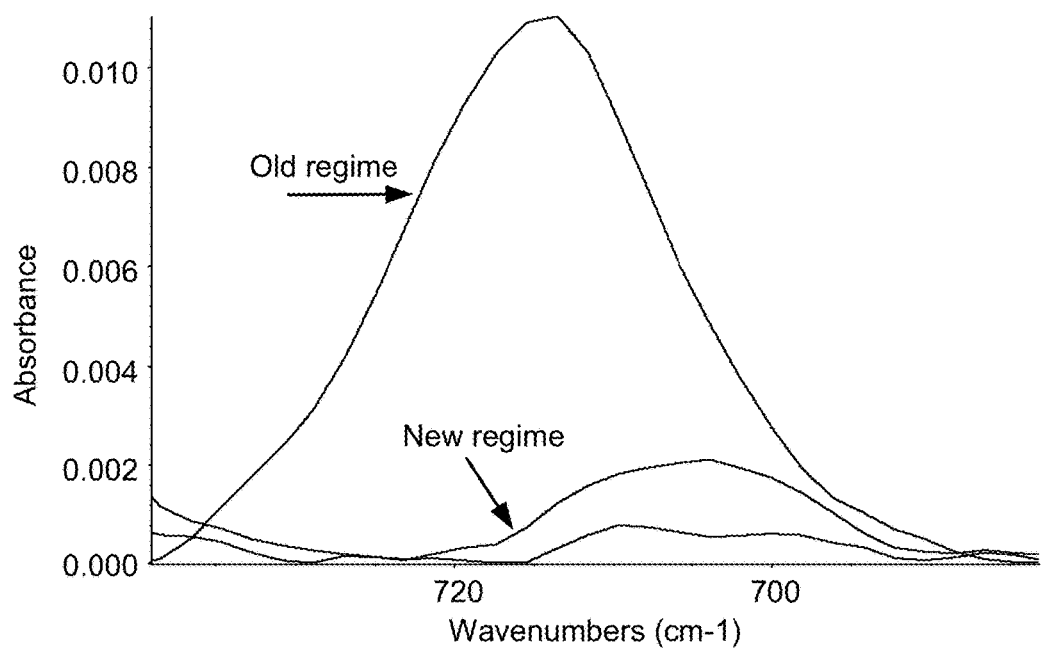

FIGS. 5A-5C show FTIR graphs with vibration peaks for detecting $(NH_4)_2SiF_6$ in various temperature regimes. Detection of a chemical species can be made by indication of bonds undergoing certain kinds of vibrational modes, such as stretching and bending. In FIG. 5A, detection of $(NH_4)_2SiF_6$ can be made by indication of N—H bonds undergoing symmetric stretching at a peak of about 3300 $cm^{-1}$. In FIG. 5B, detection of $(NH_4)_2SiF_6$ can be made by indication of N—H bonds undergoing bending (e.g., rocking) at a peak of about 1425 $cm^{-1}$. In FIG. 5C, detection of $(NH_4)_2SiF_6$ can be made by indication of Si—F bonds at a peak of about 717 $cm^{-1}$. In each of the FTIR graphs, the presence of $(NH_4)_2SiF_6$ was detected at temperatures in the deposition regime. However, in the clean regime, no $(NH_4)_2SiF_6$ was detected. Whereas wafer temperatures in the deposition regime (e.g., 60° C. and higher) lead to the formation of solid byproduct, maintaining wafer temperatures in the clean regime (e.g., 40° C. and lower) avoids the formation of solid byproduct.

Figure 6:
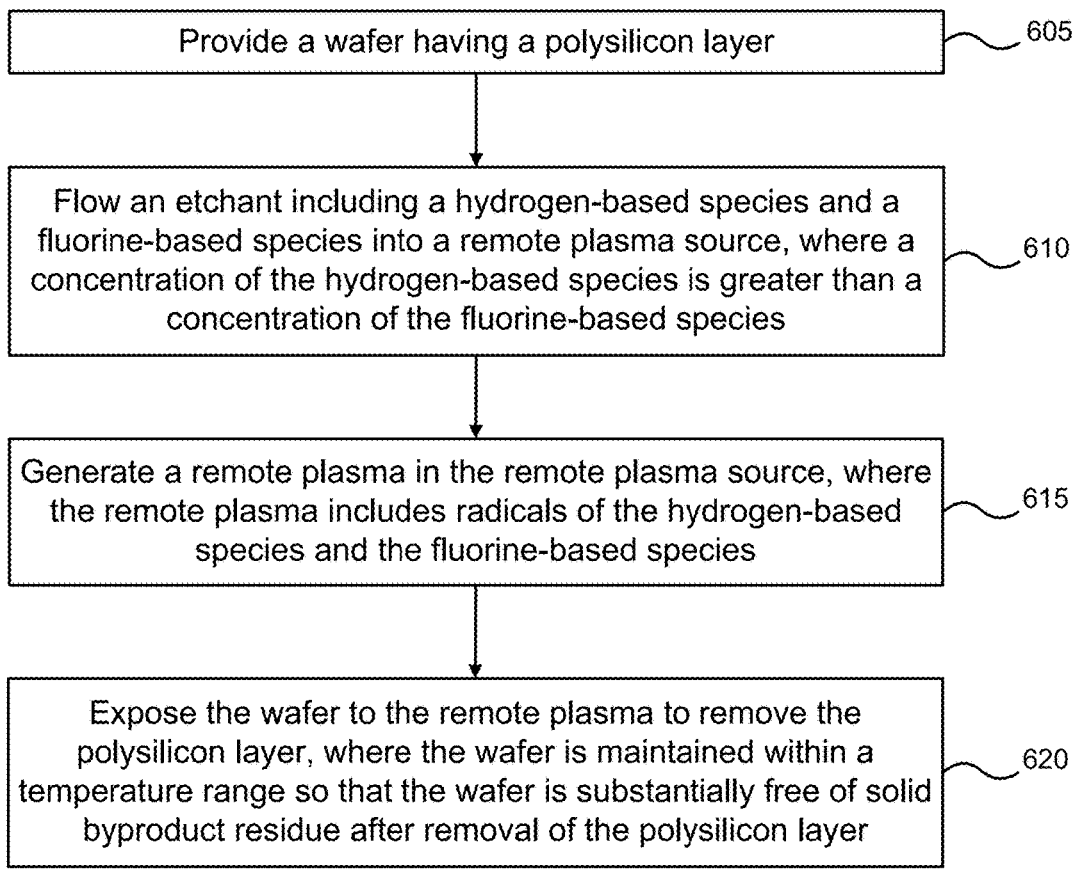
FIG. 6 shows a flow diagram of an example process for removing polysilicon from a wafer.

FIG. 6 shows a flow diagram of an example process for removing polysilicon from a wafer. The operations in a process 600 may be performed in different orders and/or with different, fewer, or additional operations.

The process 600 can begin at block 605, where a wafer having a polysilicon layer is provided. In some implementations, the wafer can be a semiconductor wafer, such as a 200-mm, 300-mm, or 450-mm wafer, including silicon wafers having one or more layers of material such as dielectric, conducting, or semiconducting material deposited thereon. In some implementations, the wafer can be part of a memory device or logic device. The memory or logic device can include structures such as those illustrated in FIGS. 1, 2, and 3A-3C. The wafer can have a polysilicon layer and at least one of a nitride and an oxide layer, where the nitride layer can include silicon nitride or titanium nitride, and where the oxide layer can include silicon oxide such as thermal silicon oxide. In some implementations, the wafer can also include various topographical features. Such features may have a height to lateral dimension aspect ratio of at least about 2:1, at least about 10:1, or at least about 20:1. In some implementations, at least one of the silicon nitride and the silicon oxide layer may be part of such features.

The wafer can be positioned on a wafer support in a plasma processing apparatus. In some implementations, the wafer support can be an electrostatic chuck (ESC). In some implementations, the electrostatic chuck can include a plurality of thermal zones configured to define a plurality of different temperatures across the wafer. Each of the thermal zones may be independently controllable. The plurality of thermal zones may be radially distributed from center-to-edge across the electrostatic chuck. That way, different wafer temperatures can be applied from center-to-edge of the wafer.

At block 610 of the process 600, an etchant including a hydrogen-based species and a fluorine-based species is flowed into a remote plasma source. In some implementations, a concentration of the hydrogen-based species is greater than a concentration of the fluorine-based species. In some implementations, the hydrogen-based species includes $H_2$ or $NH_3$. In some implementations, the fluorine-based species includes $NF_3$ or $CF_4$. The addition of a fluorine-based species can generally increase the etch rate of polysilicon. The relative concentration of the fluorine-based species can reach a certain limit to maintain desirable selectivity over the nitride and/or oxide layers. In some implementations, the concentration of the fluorine-based species can be less than about 50% per volume, less than about 20% per volume, or between about 0.7% and about 10% per volume. In some implementations, the concentration of the hydrogen-based species is greater than about 50% per volume, greater than about 80% per volume, or greater than about 90% per volume.

In some implementations, an inert carrier gas can be introduced with the etchant. It is believed that an inert gas carrier may reduce the likelihood of recombination of radicals in the gas phase. The inert carrier gas may influence the etch rate of polysilicon. Examples of inert gas carriers can include noble gases, such as helium (He), neon (Ne), and argon (Ar).

The etchant may be flowed into a remote plasma source towards the wafer in a plasma processing apparatus. The plasma processing apparatus may include a showerhead connected to the remote plasma source through which the etchant may be introduced to a processing chamber or region adjacent to the wafer support. The remote plasma source and the showerhead may be positioned above the wafer support. Details of an example remote plasma source may be described with reference to FIG. 10.

At block 615 of the process 600, a remote plasma is generated in the remote plasma source. The remote plasma can include radicals of the hydrogen-based species and the fluorine-based species. Various species may be present in the remote plasma, such as ions, electrons, radicals, neutral species, meta-stable species, and other species. The remote plasma may be generated upstream from the wafer and outside of the processing chamber or the region adjacent to the wafer support.

When the hydrogen-based species and the fluorine-based species are introduced into the remote plasma source, a source power may be applied to the remote plasma source. The source power may energize induction coils to generate the remote plasma, which can be an inductively-coupled plasma in the remote plasma source. The remote plasma source may generate reactive species, including plasma-activated species (e.g., radicals) of the hydrogen-based species and fluorine-based species. Such plasma-activated species may result from dissociation of the hydrogen-based species and the fluorine-based species. For example, dissociation of $H_2$ and $NF_3$ in the remote plasma may generate radicals that include $F^*$, $N^*$, $NF_x^*$, and $H^*$. In some instances, the radicals may recombine to form gaseous byproducts of HF and $NH_4F$ in the remote plasma.

Process conditions in the remote plasma source may influence the generation of plasma. For example, process conditions such as plasma frequency, plasma power, etchant chemistry, mixture of gases, gas flow rates, chamber pressure, chamber temperature, and timing may increase or decrease the density of radicals in the plasma. The apparatus design of the remote plasma source may also influence the generation of the plasma. For example, the positioning of the induction coils, the length of the induction coils, the shape of the remote plasma source, the materials of the remote plasma source, the distribution of holes in the showerhead, and the materials of the showerhead may increase or decrease the density of radicals in the plasma. In some implementations, the process conditions and apparatus design of the remote plasma source may be optimized to increase the density of radicals in the plasma. Aspects of the apparatus design may facilitate plasma recirculation in the remote plasma source to further increase the density of radicals in the plasma. A high density of radicals in the plasma may correspond to a high etch rate of polysilicon and a high selectivity against nitride and/or oxide.

At block 620 of the process 600, the wafer is exposed to the remote plasma to remove the polysilicon layer. The wafer is maintained within a temperature range so that the wafer is substantially free of solid byproduct residue during exposure to the remote plasma. The wafer temperature may be controlled by controlling the temperature of the wafer support. Ions generated in the remote plasma may be filtered by the showerhead so that the wafer may be more exposed to radicals of the hydrogen-based species and the fluorine-based species. $H^*$ radicals and $F^*$ radicals (i.e., atomic hydrogen and atomic fluorine) may react with the polysilicon layer to etch polysilicon. $H^*$ radicals can react with silicon to form a gaseous byproduct of silane. $F^*$ radicals can react with silicon to form a gaseous byproduct of tetrafluorosilane. Thus, the polysilicon layer can be etched by not only atomic hydrogen, but also by atomic fluorine. The temperature of the wafer may be maintained at a temperature to inhibit the formation of solid byproduct, such as $(NH_4)_2SiF_6$. In some implementations, the temperature range is less than about 120° C., less than about 60° C., or between about 20° C. and about 50° C. The chamber pressure can also be controlled to inhibit the formation of the solid byproduct. In some implementations, the chamber pressure can be less than about 5 Torr, or less than about 1 Torr. Without being limited by any theory, controlling the wafer temperature or chamber pressure can limit the diffusivity of HF and/or $NH_4F$ at the reaction surface, thereby inhibiting the chemical reaction for forming $(NH_4)_2SiF_6$. Controlling the wafer temperature can control the surface reaction pathway.

Under certain process conditions, such as relatively low temperatures and/or relatively low pressures, the formation of solid byproduct or salt can be suppressed. This can avoid or otherwise reduce unwanted defects in the wafer and increase throughput. Such process conditions may not only avoid unwanted solid byproduct residue, but may increase etch rate of polysilicon and increase selectivity against nitride and/or oxide layers. In some implementations, the polysilicon layer is removed at an etch rate of greater than about 2000 Å per minute. In some implementations, the selectivity of polysilicon over nitride and/or oxide layers can be greater than about 500:1 during removal of the polysilicon layer.

In some implementations, the etch rate of polysilicon can be dependent on the mixture of reactant species in the etchant. In addition to the hydrogen-based species and the fluorine-based species, the etchant can further include a modifying gas species different from both the fluorine-based species and the hydrogen-based species, where the modifying gas species includes at least one of $NF_3$, $CF_4$, $CH_3F$, and $SF_6$. The concentration of the modifying gas species is less than about 10% by volume. Radicals of the modifying gas species may be generated and the wafer may be exposed to such radicals to contribute to the removal of the polysilicon layer.

Figure 7:
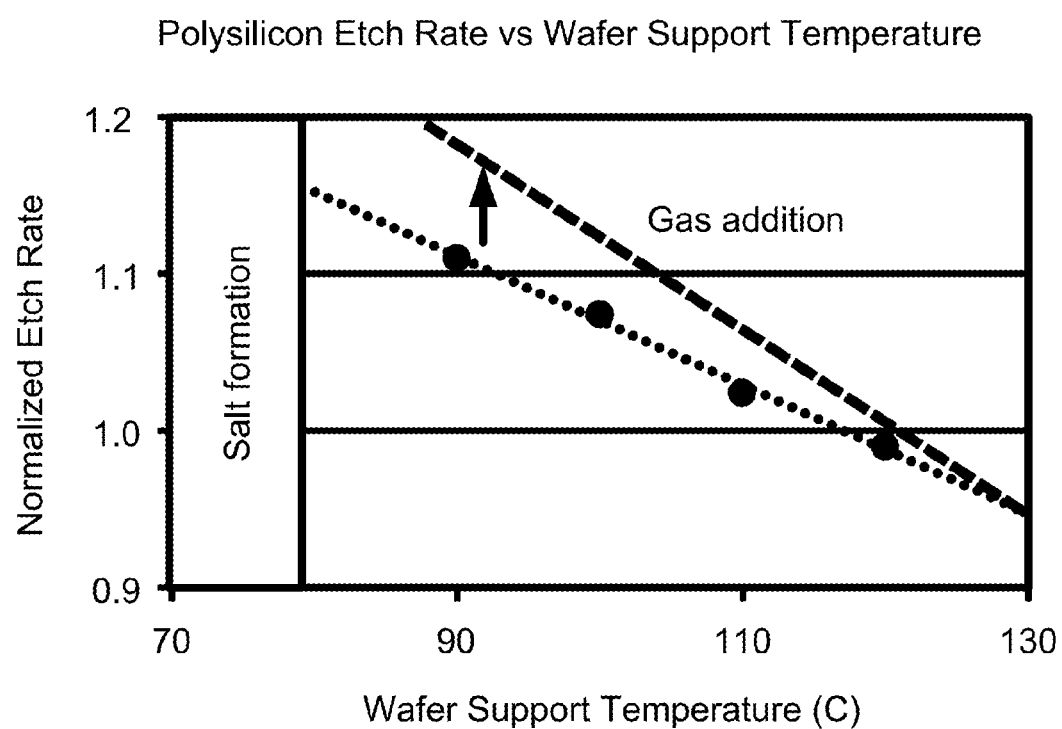
FIG. 7 illustrates a graph showing the polysilicon etch rate as a function of temperature.

FIG. 7 illustrates a graph showing the polysilicon etch rate as a function of temperature. The polysilicon etch rate increases with decreasing electrostatic chuck temperature up until the formation of salt byproduct. In addition, when modifying gas species is added to the etchant, the sensitivity of the polysilicon etch rate to temperature changes. As shown in FIG. 7, addition of at least one of $NF_3$, $CF_4$, $CH_3F$, and $SF_6$ at a concentration of less than 10% by volume increases the sensitivity of the polysilicon etch rate to temperature.

Returning to FIG. 6, in implementations where the wafer is supported on an electrostatic chuck with a plurality of thermal zones, the process 600 can further include applying a plurality of different temperatures in the thermal zones during exposure of the wafer to the remote plasma for improved uniformity of removal of the polysilicon layer. The plurality of thermal zones may be radially distributed so that different temperatures may be radially distributed across the wafer. The etch rate of polysilicon from center-to-edge of the wafer may be fine-tuned by applying different temperatures from center-to-edge of the electrostatic chuck supporting the wafer.

Figure 8A:
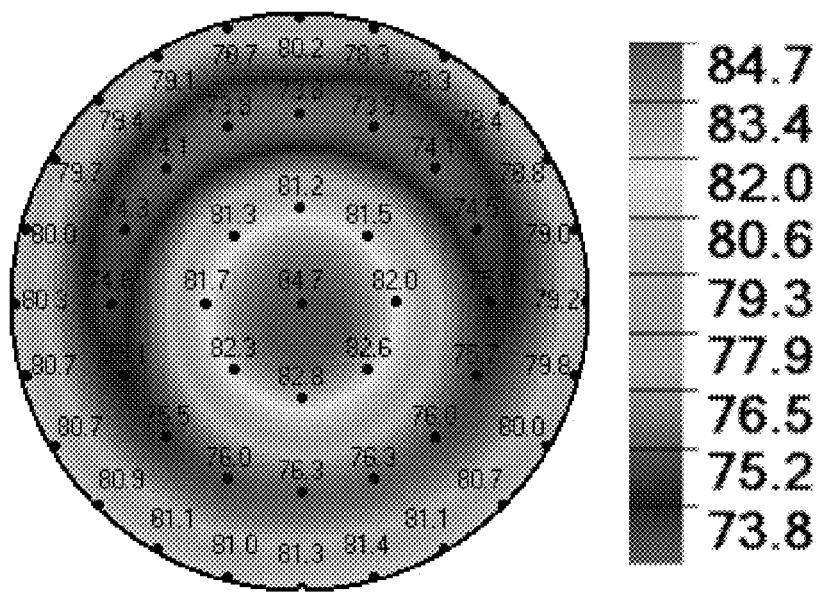
FIG. 8A shows the polysilicon etch uniformity on a wafer for an example single-zone electrostatic chuck.

FIG. 8A shows the polysilicon etch uniformity on a wafer for an example single-zone electrostatic chuck. A single temperature of 100° C. was applied across the entirety of the electrostatic chuck, and the polysilicon etch ranged from 73.8 nm to 84.7 nm. The mean was 78.7 nm, the 3-sigma standard deviation was 8.9 nm (11.3%), and the range was 10.9 nm (13.9%).

Figure 8B:
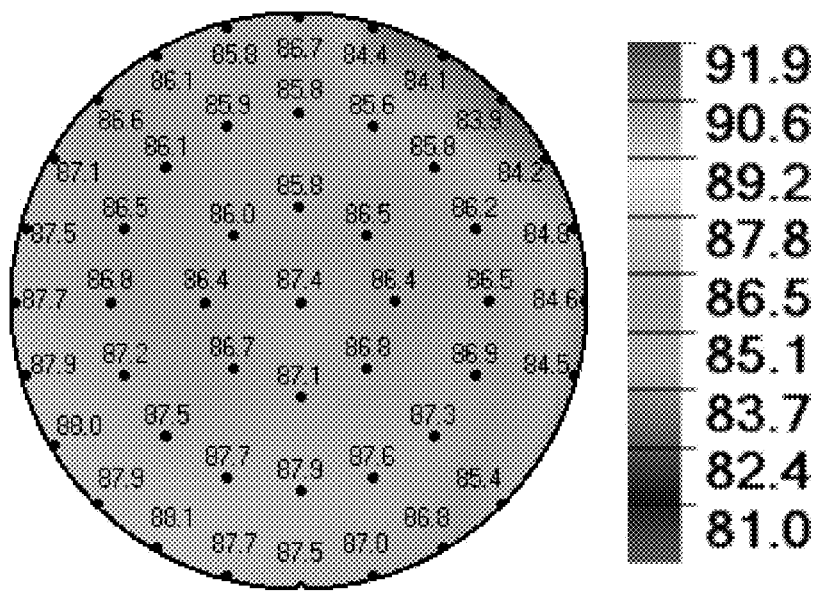
FIG. 8B shows the polysilicon etch uniformity on a wafer for an example multi-zone electrostatic chuck.

FIG. 8B shows the polysilicon etch uniformity on a wafer for an example multi-zone electrostatic chuck. A temperature of 110° C. was applied at the center of the electrostatic chuck, a temperature of 100° C. was applied in a first ring surrounding the center of the electrostatic chuck, a temperature of 95° C. was applied in a second ring surrounding the first ring, and a temperature of 100° C. was applied in a third ring at the periphery of the electrostatic chuck and surrounding the second ring. The polysilicon etch ranged from 83.9 nm to 88.1 nm. The mean was 86.5 nm, the 3-sigma standard deviation was 3.4 nm (3.9%), and the range was 4.2 nm (4.8%). The data shown in FIGS. 8A and 8B show that polysilicon etch uniformity across a wafer can be improved by controlling temperature across multiple thermal zones in an electrostatic chuck.

Returning to FIG. 6, in implementations where a native oxide layer is formed on a polysilicon layer, the process 600 can further include applying a bias to the wafer support to generate a capacitively-coupled plasma of at least a fluorine-based etchant between the remote plasma source and the wafer support, and exposing the wafer to the capacitively-coupled plasma to remove the native oxide layer. In some implementations, the fluorine-based etchant can include $CF_4$. Removal of the native oxide layer may be performed in situ with removal of the polysilicon layer.

Removal of polysilicon may be hindered by the presence of native oxides. A native oxide layer, such as a native silicon oxide layer, can form on a polysilicon layer when exposed to ambient conditions or oxygen, as shown in FIG. 2. Some example plasma treatment of wafers to remove native oxides are described in U.S. application Ser. No. 13/916,497, filed Jun. 12, 2013, titled "REMOVAL OF NATIVE OXIDE WITH HIGH SELECTIVITY," now issued as U.S. Pat. No. 9,034,773, and U.S. application Ser. No. 14/577,977, filed Dec. 19, 2014, titled "CONTACT CLEAN IN HIGH-ASPECT RATIO STRUCTURES," each of which is incorporated herein by reference in its entirety and for all purposes.

In some implementations, an etchant for removing the native oxide layer may be flowed towards the wafer prior to flowing etchant for removing the polysilicon layer. The etchant for removing the native oxide layer may include a fluorine-based etchant, such as $CF_4$, or a mixture of a hydrogen-based etchant and a fluorine-based etchant, such as $H_2$ and $NF_3$. The etchant for removing the native oxide layer may be provided in a region between the showerhead and the wafer support. The bias may be applied to the wafer support to generate the capacitively-coupled between the showerhead and the wafer support, where the showerhead can be electrically grounded. The capacitively-coupled plasma can include ions, radicals, and other plasma-activated species of the fluorine-based etchant. Exposure to the capacitively-coupled plasma can remove the native oxide layer to perform a native oxide breakthrough step. The native oxide breakthrough step can be subsequently followed by generation of an inductively-coupled plasma in the remote plasma source for removing the polysilicon layer, where the native oxide breakthrough step and the removal of the polysilicon layer can occur in the same plasma processing apparatus. Put another way, the native oxide breakthrough and the removal of the polysilicon layer can occur in situ so that the wafer need not be transferred to a separate tool or chamber.

Figure 9:
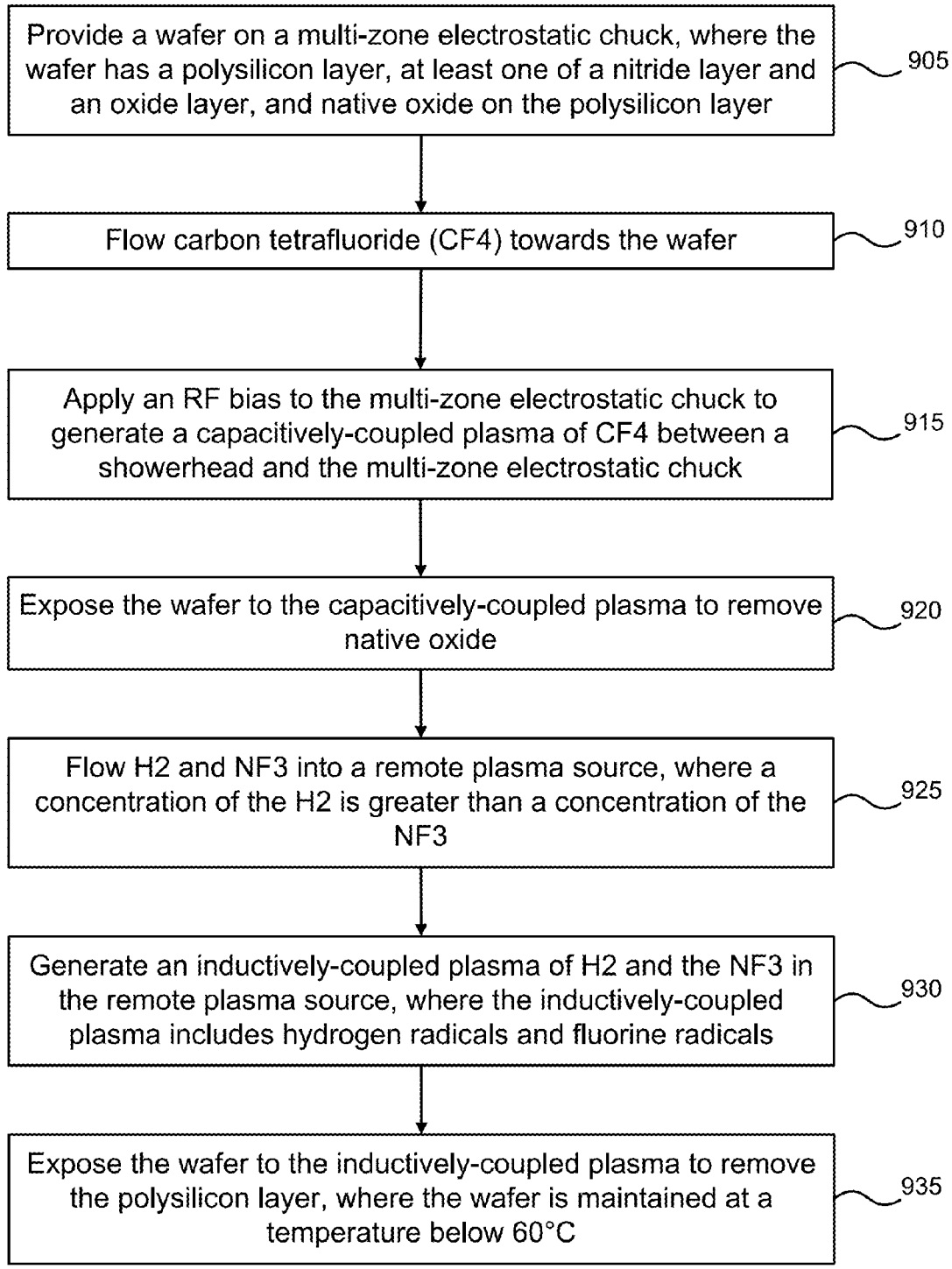
FIG. 9 shows a flow diagram of an example process for removing native oxide and polysilicon from a wafer.

FIG. 9 shows a flow diagram of an example process for removing native oxide and polysilicon from a wafer. The operations in a process 900 may illustrate an example of in situ removal of native oxide and polysilicon. The operations in the process 900 may be performed in different orders and/or with different, fewer, or additional operations.

The process 900 can begin at block 905, where a wafer is provided on a multi-zone electrostatic chuck, and where the wafer has a polysilicon layer, at least one of a nitride layer and an oxide layer, and native oxide on the polysilicon layer. In some implementations, the wafer can be a semiconductor wafer, such as a 200-mm, 300-mm, or 450-mm wafer, including silicon wafers having one or more layers of material such as dielectric (e.g., low-k dielectric), conducting, or semiconducting material deposited thereon. In some implementations, the wafer can be part of a memory device or logic device. The memory or logic device may include structures such as those illustrated in FIGS. 1, 2, and 3A-3C. In some implementations, the nitride layer can include silicon nitride or titanium nitride, and the oxide layer can include silicon oxide such as thermal silicon oxide. In some implementations, the wafer can also include various topographical features. Such features may have a height to lateral dimension aspect ratio of at least about 2:1, at least about 10:1, or at least about 20:1. In some implementations, at least one of the nitride and the oxide layer may be part of such features.

The electrostatic chuck may include a plurality of thermal zones configured to provide independently controllable temperatures in each zone. The plurality of thermal zones may be defined in a radial configuration from center-to-edge. The thermal zones may be circular or annularly-shaped. The thermal zones may be independently controlled so that a radial temperature profile across a wafer can be applied. An example of a multi-zone electrostatic chuck is described in U.S. patent application Ser. No. 11/562,884, filed Nov. 22, 2006, titled "ELECTROSTATIC CHUCK HAVING RADIAL TEMPERATURE CONTROL CAPABILITY," which is incorporated herein by reference in its entirety and for all purposes. Polysilicon etch uniformity can be improved by independently controlling the temperature of each of the thermal zones in the multi-zone electrostatic chuck.

At block 910 of the process 900, $CH_4$ is flowed towards the wafer. The etchant may be provided into a region adjacent to the wafer. In some implementations, the etchant is delivered through a showerhead into a region between the wafer support and the showerhead.

At block 915 of the process 900, an RF bias is applied to the multi-zone electrostatic chuck to generate a capacitively-coupled plasma of $CF_4$ between a showerhead and the multi-zone electrostatic chuck. The multi-zone electrostatic chuck may be biased while the showerhead is electrically grounded. The capacitively-coupled plasma can include ions, radicals, and other plasma-activated species of $CF_4$. In some implementations, the capacitively-coupled plasma of $CF_4$ is an in situ plasma of $CF_4$ between the showerhead and the wafer, where the bias can be controlled to increase or decrease the ion bombardment with respect to the generated in situ plasma. In some implementations, the bias can be between about 100 W and about 2000 W.

At block 920 of the process 900, the wafer is exposed to the capacitively-coupled plasma to remove native oxide. Exposure to the capacitively-coupled plasma can remove native oxide to perform a native oxide breakthrough step. The capacitively-coupled plasma of $CF_4$ can etch the native oxide at a relatively high etch rate while avoid salt formation and polymerizing chemistry. Moreover, the capacitively-coupled plasma can be selective against etching of the nitride and/or oxide layer.

At block 925 of the process 900, $H_2$ and $NF_3$ are flowed into a remote plasma source, where a concentration of the $H_2$ is greater than a concentration of the $NF_3$. In some implementations, the concentration of the $NF_3$ can be less than about 50% per volume, less than about 20% per volume, or between about 0.7% and about 10% per volume. In some implementations, the concentration of the $H_2$ is greater than about 50% per volume, greater than about 80% per volume, or greater than about 90% per volume. In some implementations, an inert carrier gas can be flowed with $H_2$ and $NF_3$. Examples of inert gas carriers can include noble gases, such as He, Ne, and Ar. In some implementations, a modifying gas species, such as $CF_4$, $CH_3F$, and $SF_6$, may be added at concentrations less than about 10% per volume with $H_2$ and $NF_3$ to adjust the temperature sensitivity of a polysilicon etch rate.

At block 930 of the process 900, an inductively-coupled plasma of $H_2$ and $NF_3$ is generated in the remote plasma source, where the inductively-coupled plasma includes hydrogen radicals and fluorine radicals. Various species may be present in the inductively-coupled plasma, such as ions, electrons, radicals, neutral species, meta-stable species, and other species. A source power may energize induction coils to generate the inductively-coupled plasma. The inductively-coupled plasma may be generated upstream from the wafer and outside of a processing chamber or region adjacent to the wafer.

In some implementations, process conditions and the design of the remote plasma source can produce a high radical density in the inductively-coupled plasma, where higher radical density can correspond to a higher polysilicon etch rate and increased molecular passivation can lead to higher selectivity. In some implementations, a reduced coil voltage applied to the remote plasma source can reduce sputtering in the remote plasma source and showerhead, which increases the radical density. In some implementations, a higher pressure can lead to higher RF coupling efficiency, which increases the radical density. The pressure can be between about 0.1 Torr and 10 Torr. Other process conditions and apparatus design aspects may increase radical density in the remote plasma source.

At block 935 of the process 900, the wafer is exposed to the inductively-coupled plasma to remove the polysilicon layer, where the wafer is maintained at a temperature below 60° C. The wafer temperature may be actively controlled during plasma treatment by the multi-zone electrostatic chuck. By controlling the wafer temperature to be below 60° C., certain reaction pathways may be promoted while other reaction pathways may be suppressed. Specifically, reaction pathways of $Si_{(s)}+4H^* \rightarrow SiH_{4(g)}$ and $Si_{(s)}+4F^* \rightarrow SiF_{4(g)}$ are promoted while the reaction pathway of $Si_{(s)}+4HF_{(g)}+2NH_4F_{(g)} \rightarrow ((NH_4)_2SiF_6)_{(s)}+2H_{2(g)}$ is suppressed. In some implementations, the wafer can be maintained at temperature between about 20° C. and about 50° C. to avoid formation of $(NH_4)_2SiF_6$. Ions generated in the inductively-coupled plasma may be filtered by the showerhead so that the wafer may be more exposed to hydrogen radicals and fluorine radicals. In some implementations, the chamber pressure can be controlled to suppress the reaction pathway for forming $(NH_4)_2SiF_6$. For example, the chamber pressure can be less than about 5 Torr, or less than about 1 Torr.

In some implementations, the polysilicon layer is removed at an etch rate of greater than about 2000 Å per minute. In some implementations, the selectivity of polysilicon over nitride and/or oxide layers can be greater than about 500:1 during removal of the polysilicon layer.

Apparatus

An apparatus for performing removal of polysilicon and/or removal of native oxide can include a plasma processing apparatus. The plasma processing apparatus can include a plasma etch chamber. The methods described above may be performed in an inductively-coupled plasma chamber, capacitively-coupled plasma chamber, or a combination of both. Removal of polysilicon and native oxides may be performed within the same plasma processing apparatus. In some implementations, the plasma processing apparatus may be electrically connected to a source power for generating an inductively-coupled plasma and a bias power for generating a capacitively-coupled plasma.

FIG. 10 shows a schematic diagram of a plasma processing apparatus for performing the process of removing polysilicon from a wafer. The plasma processing apparatus 1000 includes a remote plasma source 1050 and a processing chamber 1025 outside of the remote plasma source 1050. The remote plasma source 1050 can be configured to generate a remote plasma 1060, where the remote plasma 1060 can be an inductively-coupled plasma. Activated species 1004 of the remote plasma 1060 may be introduced from the remote plasma source 1050 through a showerhead 1054. A wafer 1020 can be positioned on a wafer support 1010, where the wafer support 1010 can hold the wafer 1020 in place by an electrostatic chuck. Other clamping mechanisms may also be employed. The wafer 1020 can include structures such as those illustrated in FIGS. 1, 2, and 3A-3C.

Treatment gases 1002 may be supplied to the remote plasma source 1050 via a gas inlet 1052. In some implementations, the treatment gases 1002 include a hydrogen-based species, such as $H_2$ or $NH_3$, and a fluorine-based species, such as $NF_3$, $CF_4$, or $SF_6$. Other carrier gases or modifying gas species as described above may be introduced with the treatment gases 1002. The gas inlet 1052 may distribute the treatment gases 1002 into the remote plasma source 1050 prior to generation of the inductively-coupled plasma. One or more valves may control the introduction of treatment gases 1002 into the remote plasma source 1050. The remote plasma source 1050 can be a container of any suitable shape, such as dome-shaped, conical-shaped, or cylindrical-shaped. In some implementations, the container of the remote plasma source 1050 can be shaped to optimize plasma recirculation flow and plasma density. The gas inlet 1052 may be configured to distribute the treatment gases 1002 towards sidewalls of the remote plasma source 1050 or along the sidewalls of the remote plasma source 1050. Sidewalls of the remote plasma source 1050 may include materials that are capable of enhancing the electric field. For example, the sidewalls may include a dielectric material, such as quartz, aluminum, aluminum oxide, or ceramic. In some implementations, the sidewalls can include a ceramic coating to limit sputtering.

Coils 1056 may surround at least a portion of the container of the remote plasma source 1050. The coils 1056 may be in electrical communication with an RF power source for generating a remote plasma 1060 in the remote plasma source 1050. In some implementations, the coils 1056 may surround an upper portion of the container and a lower portion of the container. In some implementations, the coils 1056 may be divided into a top coil 1056a and a bottom coil 1056b, where the top coil 1056a constitutes one zone powered by a certain frequency and the bottom coil 1056b constitutes another zone powered by a certain frequency. While the plasma processing apparatus 1000 in FIG. 10 shows two separate RF power sources for coils 1056, the plasma processing apparatus 1000 may be limited to a single RF power source for coils 1056.

The arrangement of the coils 1056 may influence the coupling of the RF power with the remote plasma 1060 for increasing the density of radicals. For example, the positioning of the coils 1056, the length of the coils 1056, and the spacing between the coils 1056 and the container may influence the coupling of the RF power with the remote plasma 1060. When the treatment gases 1002 are provided in the remote plasma source 1050 and the coils 1056 are energized, a remote plasma 1060 may be ignited to form activated species 1004 of the treatment gases 1002. The activated species 1004 may include radicals, ions, and other active species of the treatment gases 1002. The activated species 1004 may pass through the showerhead 1054 towards the wafer 1020. In some implementations, the activated species 1004 from the remote plasma 1060 can be used to etch polysilicon on the wafer 1020 at a high etch rate with high selectivity. In some implementations, the showerhead 1054 may filter out ions of the activated species 1004.

In some implementations, the wafer support 1010 may be a pedestal for supporting a wafer 1020 that can be actively cooled or actively heated to control the temperature of the wafer 1020. For example, the temperature of the wafer 1020 can be maintained within a certain temperature range, such as less than about 120° C., less than about 60° C., or between about 20° C. and about 50° C. This can limit the formation of solid byproduct during exposure of the wafer 1020 to the remote plasma 1060.

In some implementations, the wafer support 1010 can include an electrostatic chuck, where the electrostatic chuck can include a biasing electrode for applying a bias to the wafer 1020 during an etching process. An in situ plasma 1030 may be generated between the showerhead 1054 and the wafer 1020 when a bias is applied to the wafer 1020, where the in situ plasma 1030 can be a capacitively-coupled plasma. A gas or gas mixture 1006 may be introduced into the processing chamber 1025 outside of the remote plasma source 1050. The gas or gas mixture 1006 may be introduced from the showerhead 1054 or from one or more gas inlets (not shown) coupled to the processing chamber 1025. In some implementations, the gas or gas mixture 1006 may include at least a fluorine-based etchant, such as $CF_4$. The applied bias can produce an RF field to the gas or gas mixture 1006 between the showerhead 1054 and the wafer 1020. The showerhead 1054 may be electrically grounded and may couple with the wafer support 1010 to ignite the in situ plasma. In some implementations, the showerhead 1054 may be anodized. Ionization of the gas or gas mixture 1006 can ignite the in situ plasma 1030 to form activated species of the gas or gas mixture 1006. In some implementations, the activated species of the in situ plasma 1030 can be used to etch native oxides on the wafer 1020.

In some implementations, the wafer support 1010 can include a plurality of thermal zones configured to provide independently controllable temperatures in each zone. The plurality of thermal zones may be defined in a radial configuration from center-to-edge. The thermal zones may be circular or annularly-shaped. The thermal zones may be independently controlled so that a radial temperature profile across the wafer 1020 can be applied. The thermal zones in the wafer support 1010 may improve uniformity of etching across the wafer 1020.

Details of an example plasma processing apparatus are described in U.S. patent application Ser. No. 14/676,710, filed Apr. 1, 2015, titled "METHOD FOR ACHIEVING ULTRA-HIGH SELECTIVITY WHILE EETCHING SILICON NITRIDE," which is incorporated herein by reference in its entirety and for all purposes.

The plasma processing apparatus 1000 may include a controller 1040. The controller 1040 may be part of a system, which may be part of the plasma processing apparatus 1000. Such systems can comprise semiconductor processing equipment, including a processing tool or tools, chamber or chambers, a platform or platforms for processing, and/or specific processing components (a wafer support, a gas flow system, etc.). These systems may be integrated with electronics for controlling their operation before, during, and after processing of the wafer 1020. The electronics may be referred to as the "controller," which may control various components or subparts of the system or systems. The controller 1040, depending on the processing requirements and/or the type of system, may be programmed to control any of the processes disclosed herein, including the delivery of processing gases, temperature settings (e.g., heating and/or cooling), pressure settings, vacuum settings, power settings, RF generator settings, RF matching circuit settings, frequency settings, flow rate settings, fluid delivery settings, positional and operation settings, wafer transfers into and out of a tool and other transfer tools and/or load locks connected to or interfaced with a specific system.

The controller 1040, depending on the processing conditions and/or type of system, may be programmed to control any of the processes disclosed herein, including delivery of gases, temperature settings (e.g., heating and/or cooling), pressure settings, vacuum settings, power settings, RF generator settings, RF matching circuit settings, frequency settings, flow rate settings, fluid delivery settings, positional and operation settings, wafer transfers into and out of a tool and/or load locks connected to or interfaced with a specific system. The controller 1040 may provide program instructions for implementing the above-described etch processes. The program instructions may control a variety of process parameters, such as RF bias power level, RF source power level, current in zones of multi-zone coil, temperature in thermal zones of a multi-zone electrostatic chuck, chamber pressure, gas flow rates, gas composition, etc. For example, the controller 1040 may provide instructions for maintaining a wafer within a temperature range below about 60° C. The controller 1040 may provide instructions for establishing a pressure in the plasma processing apparatus 1000 that is less than about 5 Torr, or between about 0.1 Torr and 5 Torr, or less than about 1 Torr.

Broadly speaking, the controller 1040 may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller 1040 in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, surfaces, circuits, and/or dies of a wafer.

The controller 1040, in some implementations, may be a part of or coupled to a computer that is integrated with, coupled to the system, otherwise networked to the system, or a combination thereof. For example, the controller 1040 may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller 1040 receives instructions in the form of data, which specify parameters for each of the processing steps to be performed during one or more operations. It should be understood that the parameters may be specific to the type of process to be performed and the type of tool that the controller 1040 is configured to interface with or control. Thus as described above, the controller 1040 may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller 1040 may communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

The plasma processing apparatus 1000 may be configured to remove a polysilicon layer from a wafer 1020. The wafer 1020 includes the polysilicon layer and at least one of an oxide layer and a nitride layer. In some implementations, the wafer 1020 further includes a native oxide layer on the polysilicon layer. The plasma processing apparatus 1000 can include a remote plasma source 1050 and a wafer support 1010 for supporting the wafer 1020 and outside of the remote plasma source 1050. The plasma processing apparatus 1000 further includes a controller 1040 configured to provide instructions for performing the following operations: (a) flowing an etchant 1002 including a hydrogen-based species and a fluorine-based species into the remote plasma source 1050, where a concentration of the hydrogen-based species is greater than a concentration of the fluorine-based species; (b) generating a remote plasma 1060 in the remote plasma source 1050, where the remote plasma 1060 includes radicals 1004 of the hydrogen-based species and the fluorine-based species; and (c) exposing the wafer 1020 to the remote plasma 1060 to remove the polysilicon layer, where the wafer 1020 is maintained within a temperature range so that the wafer 1020 is substantially free of solid byproduct residue during exposure to the remote plasma 1060. In some implementations, the nitride layer includes at least one of a layer of silicon nitride and titanium nitride, and the oxide layer includes at least a layer of thermal silicon oxide. In some implementations, the plasma processing apparatus 1000 further includes a showerhead 1054 between the wafer support 1010 and the remote plasma source 1050, where the plasma processing apparatus 1000 is configured to generate an inductively-coupled plasma 1060 in the remote plasma source 1050, and where the plasma processing apparatus 1000 is configured to generate a capacitively-coupled plasma 1030 between the wafer support 1010 and the showerhead 1054. In some implementations, the controller 1040 may be further configured with instructions for performing the following operations: applying a bias to the wafer support 1010 to generate a capacitively-coupled plasma 1030 of at least a fluorine-based etchant between the remote plasma source 1050 and the wafer support 1010; and exposing the wafer 1020 to the capacitively-coupled plasma 1030 to remove the native oxide layer, where removal of the native oxide layer is performed in situ with removal of the polysilicon layer.

Lithographic Patterning

The apparatuses/processes described hereinabove may be used in conjunction with lithographic patterning tools or processes, for example, for the fabrication or manufacture of semiconductor devices, displays, LEDs, photovoltaic panels and the like. Typically, though not necessarily, such tools/processes will be used or conducted together in a common fabrication facility. Lithographic patterning of a film typically comprises some or all of the following steps, each step enabled with a number of possible tools: (1) application of photoresist on a workpiece, i.e., substrate, using a spin-on or spray-on tool; (2) curing of photoresist using a hot plate or furnace or UV curing tool; (3) exposing the photoresist to visible or UV or x-ray light with a tool such as a wafer stepper; (4) developing the resist so as to selectively remove resist and thereby pattern it using a tool such as a wet bench; (5) transferring the resist pattern into an underlying film or workpiece by using a dry or plasma-assisted etching tool; and (6) removing the resist using a tool such as an RF or microwave plasma resist stripper.

Other Embodiments

Although illustrative embodiments and applications of this invention are shown and described herein, many variations and modifications are possible which remain within the concept, scope, and spirit of the invention, and these variations would become clear to those of ordinary skill in the art after perusal of this application. Accordingly, the present embodiments are to be considered as illustrative and not restrictive, and the invention is not to be limited to the details given herein, but may be modified within the scope and equivalents of the appended claims.

What is claimed is:

1. A method of removing a polysilicon layer from a wafer, the method comprising:
   providing a wafer having a polysilicon layer;
   flowing an etchant including a hydrogen-based species and a fluorine-based species into a remote plasma source, wherein a concentration of the hydrogen-based species is greater than a concentration of the fluorine-based species;

generating a remote plasma in the remote plasma source, wherein the remote plasma includes radicals of the hydrogen-based species and the fluorine-based species; and exposing the wafer to the remote plasma to remove the polysilicon layer, wherein the wafer is maintained within a temperature range that is less than about 60° C. so that the wafer is substantially free of solid byproduct residue during exposure to the remote plasma and during removal of the polysilicon layer.

2. The method of claim 1, wherein the wafer includes an exposed nitride and/or oxide structure.

3. The method of claim 2, wherein the exposed nitride structure includes at least one of silicon nitride and titanium nitride, and wherein the exposed oxide structure includes at least thermal silicon oxide.

4. The method of claim 2, wherein the selectivity of polysilicon over the exposed nitride and/or oxide structure is greater than about 500:1 during removal of the polysilicon layer.

5. The method of claim 1, wherein the hydrogen-based species includes hydrogen or ammonia, and wherein the fluorine-based species includes nitrogen trifluoride or carbon tetrafluoride.

6. The method of claim 1, wherein the wafer is maintained at the temperature range of less than about 60° C. to inhibit the formation of the solid byproduct residue.

7. The method of claim 1, wherein the wafer is exposed to the remote plasma in a chamber having a pressure less than about 5 Torr.

8. The method of claim 7, wherein the wafer is exposed to the remote plasma in a chamber having a pressure less than about 1 Torr.

9. The method of claim 1, wherein the wafer is supported on an electrostatic chuck a plurality of thermal zones configured to define a plurality of different temperatures across the wafer.

10. The method of claim 9, further comprising:
applying a plurality of different temperatures in the thermal zones of the electrostatic chuck during exposure of the wafer to the remote plasma for improved uniformity of removal of the polysilicon layer.

11. The method of claim 1, wherein the polysilicon layer is removed at an etch rate of greater than about 2000 Å per minute.

12. The method of claim 1, wherein the concentration of the fluorine-based species is between about 0.7% and about 10% by volume, and wherein the concentration of the hydrogen-based species is greater than about 50% by volume.

13. The method of claim 1, wherein the etchant further includes a modifying gas species different from the fluorine-based species, wherein the modifying gas species includes at least one of nitrogen trifluoride, carbon tetrafluoride, fluoromethane, and sulfur hexafluoride.

14. The method of claim 13, wherein a concentration of the modifying gas species is less than about 10% by volume.

15. The method of claim 1, wherein the wafer is supported on an electrostatic chuck and further comprises a native oxide layer on the polysilicon layer, the method further comprising:

applying a bias to the electrostatic chuck to generate a capacitively-coupled plasma of at least a fluorine-based etchant between the remote plasma source and the electrostatic chuck; and exposing the wafer to the capacitively-coupled plasma to remove the native oxide layer, wherein removal of the native oxide layer is performed in situ with removal of the polysilicon layer.

* * * * *

UNITED STATES PATENT AND TRADEMARK OFFICE
CERTIFICATE OF CORRECTION

PATENT NO. : 10,283,615 B2
APPLICATION NO. : 14/938635
DATED : May 7, 2019
INVENTOR(S) : Yang et al.

Page 1 of 1

It is certified that error appears in the above-identified patent and that said Letters Patent is hereby corrected as shown below:

In the Claims

In Claim 9
Column 21, Line 34, change "on an electrostatic chuck a plurality of thermal zones confi-" to
--on an electrostatic chuck with a plurality of thermal zones confi- --.

Signed and Sealed this
Twenty-fifth Day of February, 2020

Andrei Iancu
*Director of the United States Patent and Trademark Office*